United States Patent
Ledentsov et al.

(10) Patent No.: US 10,243,330 B2
(45) Date of Patent: Mar. 26, 2019

(54) OPTOELECTRONIC DEVICE WITH RESONANT SUPPRESSION OF HIGH ORDER OPTICAL MODES AND METHOD OF MAKING SAME

(71) Applicant: VI Systems GmbH, Berlin (DE)

(72) Inventors: Nikolay Ledentsov, Berlin (DE); Vitaly Shchukin, Berlin (DE)

(73) Assignee: VI SYSTEMS GMBH, Berlin (DE)

( * ) Notice: Subject to any disclaimer, the term of this patent is extended or adjusted under 35 U.S.C. 154(b) by 0 days.

(21) Appl. No.: 13/771,875

(22) Filed: Feb. 20, 2013

(65) Prior Publication Data
US 2018/0233882 A1 Aug. 16, 2018

Related U.S. Application Data

(60) Provisional application No. 61/633,919, filed on Feb. 21, 2012.

(51) Int. Cl.
| | |
|---|---|
| *H01S 5/18* | (2006.01) |
| *H01S 5/183* | (2006.01) |
| *H01S 5/20* | (2006.01) |
| *H01S 5/22* | (2006.01) |
| *H01S 5/10* | (2006.01) |
| *H01S 5/02* | (2006.01) |

(52) U.S. Cl.
CPC ........ *H01S 5/18302* (2013.01); *H01S 5/0215* (2013.01); *H01S 5/1021* (2013.01); *H01S 5/1833* (2013.01); *H01S 5/18311* (2013.01); *H01S 5/18352* (2013.01); *H01S 5/205* (2013.01); *H01S 5/222* (2013.01); *H01S 2301/166* (2013.01)

(58) Field of Classification Search
CPC ............ H01S 5/18302; H01S 5/18311; H01S 5/18352; H01S 5/183; H01S 5/0215; H01S 5/1021; H01S 5/205; H01S 5/222; H01S 2301/166

See application file for complete search history.

(56) References Cited

U.S. PATENT DOCUMENTS

2013/0034117 A1* 2/2013 Hibbs-Brenner ... H01S 5/34326
372/45.01

* cited by examiner

*Primary Examiner* — Armando Rodriguez
(74) *Attorney, Agent, or Firm* — Gordon Rees Scully; Mansukhani, LLP

(57) ABSTRACT

Optical beam quality of an optoelectronic device is improved by suppression of high-order transverse optical modes by their resonant interaction with the continuum of modes in the surrounding regions, such continuum being realized by replacement of one or several layers by layers having a lower refractive index. In particular, selective oxidation of GaAlAs-based vertical cavity surface emitting laser results in (Ga)AlO layers surrounding the aperture and having a lower refractive index than the original (Ga)AlAs layers. The continuum of optical modes originates due to the modification of the optical field in the areas surrounding the aperture caused by the low index insertions positioned to result in enhancement of the optical field in their vicinity. High-order lateral optical modes in the aperture region exhibit larger leakage losses than the fundamental lateral optical mode due to the resonant interaction with the continuum of modes outside the aperture, enabling single-mode lasing from a broad aperture vertical cavity surface emitting laser.

30 Claims, 28 Drawing Sheets

(a)

(b)

OPTOELECTRONIC DEVICE WITH RESONANT SUPPRESSION OF HIGH ORDER OPTICAL MODES AND METHOD OF MAKING SAME

REFERENCE TO RELATED APPLICATIONS

This application claims an invention which was disclosed in Provisional Application No. 61/633,919, filed Feb. 21, 2012, entitled "Optoelectronic Device with Resonant Suppression of High Order Modes and Method of Making Same". The benefit under 35 USC § 119(e) of the United States provisional application is hereby claimed, and the aforementioned application is hereby incorporated herein by reference.

BACKGROUND OF THE INVENTION

Field of the Invention

The invention pertains to the field of optoelectronic devices. More particularly, the invention pertains to light emitting devices.

Description of Related Art

Light-emitting devices are presently broadly used in multiple applications, particularly in lighting, projection displays, sensing, material processing, optical storage, optical data transmission and in other applications. In case of light emitting devices the light may be emitted in a single or in multiple modes at the same or at different wavelengths. The devices may be designed to emit in the fundamental or high order transverse modes. Conventional narrow-stripe edge-emitting double heterostructure laser is typically designed to emit in the fundamental transverse mode. As opposite broad area edge-emitting lasers or industrial surface-emitting lasers emit typically in multiple transverse modes. Edge emitting tilted cavity lasers or tilted wave lasers are unique as they may emit in a single vertical high order transverse mode having a significant contribution of the $\vec{k}$-vector in the direction perpendicular to the plane of the layers. Also in this case laterally multimode operation is possible if the width of the stripe is large. At the same time, to ensure sufficient power of the device it is of utmost importance to have large surface area of the excitation region to avoid gain saturation and thermal roll-over effects. Importance of the relation between the output power and single mode operation can be illustrated by the vertical-cavity surface-emitting laser (VCSEL). The device contains gain medium, which is either excited by current injection or by photopumping. If the aperture region, where the excitation region is placed, is small, the device can emit in a single transverse mode at a fixed wavelength with a well-defined shape of the light beam and the field intensity maximum in the direction perpendicular to the surface. Once the size of the aperture increases beyond some critical value, excited transverse modes appear. This phenomenon is well explained in multiple books on VCSELs (e.g., Wilmsen, C., Temkin, H., and Coldren, L. A., eds. [*Vertical Cavity Surface Emitting Lasers. Design, Fabrication, Characterization, and Applications*], Section 2.3; Cambridge University Press, (1999)). In case of the multimode operation the device emits at several wavelengths and with a complex far field pattern composed of multiple lobes oriented in different directions. These phenomena make focusing to a single spot of the light coming out of the device hardly possible and adversely affects multiple applications like optical data transmission. Thus, it makes efficient coupling to a single mode fiber questionable. Similar problems occur also in tilted cavity laser, tilted wave laser, passive cavity laser, near-field laser. To overcome the problem of low single mode power of the VCSEL in some applications multiple lasers on a single wafer having small apertures are used. This allows achieving very high single mode power. However, as each laser emits independently, the resulting beam is not focusable to a small spot also in this case. To ensure single mode lasing in large aperture devices complex approaches are used. For example, applying of external resonators to semiconductor disc lasers gain significant interest. However, the need in a complex optical system makes the device bulky and expensive.

An approach to realize single mode VCSELs at relatively large aperture sizes was proposed (Y. A. Wu, G. S. Li, R. F. Nabiev, K. D. Choquette, C. Caneau, C. J. Chang-Hasnain, "Single-mode, passive antiguide vertical cavity surface emitting laser", IEEE Journal of Selected Topics in Quantum Electronics, Volume 1, pp. 629-637 (1995); U.S. Pat. No. 5,539,759, "Single mode laser with a passive antiguide region", by Chang-Hasnain et al., filed Oct. 4, 1994, issued Jul. 23, 1996, wherein both sources are incorporated herein by reference). In that case the VCSEL material around the aperture region was etched off and then overgrown by the material having a higher refractive index (FIG. 1(a)). The prior art VCSEL (100) is schematically shown in FIG. 1(a). The VCSEL is grown on an n-doped substrate (101), and contains an n-doped distributed Bragg reflector (DBR) (102), a cavity (103), and a p-doped DBR (108). The n-contact (111) is mounted on the substrate (101), and the p-contact (112) is mounted on the top of p-doped DBR (108). The material around the aperture region (110) is etched off and overgrown by a material (120) having a higher refractive index. The profile of the refractive index averaged in the vertical direction, is presented as a function of a lateral coordinate in FIG. 1(b). The central mesa of the VCSEL, where light is generated is surrounded by domains having a refractive index higher than that in the central area. Thus, light excited in the aperture region can leak out of the aperture region into the high refractive index material with the leaky losses of the high order modes being significantly larger than the losses for the fundamental mode. Thus fundamental mode lasing may be maintained up to large enough aperture diameters of about 20 µm.

Unfortunately the latter approach is not always compatible to the standard oxide-confined VCSEL processing technology, which excludes any steps of overgrowth and, in any case, overgrowth of AlAs-containing material may be challenging. As opposite, formation of antiguiding surrounding of the aperture region by deposition of amorphous or polycrystalline materials may create interface defects, complicate yield and reduce reliability. Additional regions surrounding the VCSEL aperture are not compatible to the technology of selective oxidation of Al(Ga)As layers presently broadly used for VCSEL manufacturing.

Thus there exists a need in an approach to realize optoelectronic devices operating in a single transverse mode at significant aperture sizes such that their fabrication matches standard manufacturing techniques.

SUMMARY OF THE INVENTION

An optoelectronic device is disclosed, in which high order transverse optical modes in the lateral aperture region are selectively suppressed by their interaction with the continuum of optical modes resonantly generated in the areas surrounding the aperture, wherein such a continuum is realized by selective replacement of one or several layers of the device structure with a layer or layers of a material having a lower refractive index than the original layer(s). In particular single mode GaAs-based vertical-cavity surface emitting lasers with oxide/confined aperture regions can be fabricated, where $Al_xGa_{1-x}As$ layers with a high (x>0.9) AlAs content are selectively oxidized resulting in $Al_xGa_{1-x}O_y$ layers surrounding the cavity and having a lower refractive index as compared to the original $Al_xGa_{1-x}As$ layers. This replacement results in the refractive index averaged in the direction perpendicular to the plane of the layers being lower in the regions laterally adjacent to the aperture region. Thus, such approach gives a nominally guiding design. The continuum of optical modes originates due to the resonant modification of the optical field in the areas surrounding the aperture caused by the low-refractive index insertions positioned to result in the enhancement of the optical field in their vicinity, for example, due to the formation of a second resonant cavity, or to enhancement of the finesse of a low-finesse cavity. This effect causes delocalization of the optical field of the fundamental mode of the optoelectronic structure in the regions outside of the aperture area. Thus the fundamental and high-order VCSEL modes in the aperture region appear to be in the continuum of the delocalized modes of the surrounding region. High-order modes having a significant $\vec{k}$-vector in the direction parallel to the plane of the layers are effectively coupled to the continuum and selectively suppressed by the optical mode resonant leakage effect. Such suppression can allow single mode lasing from a VCSEL with a broad aperture.

BRIEF DESCRIPTION OF THE DRAWINGS

FIGS. 6(a) and 6(b) combined demonstrate that the dip in the optical reflectance spectrum of the prior art VCSEL, calculated for the aperture region at oblique incidence, on the one hand, and the dip in the optical reflectance spectrum calculated for the oxide region at normal incidence, on the other hand, coincide.

FIG. 7(a) shows the refractive index profile in the oxide region, repeating FIG. 5(a).

FIG. 7(b) depicts the electric field strength profile of the vertical optical mode of the oxide region of the prior art VCSEL of FIG. 3(a).

FIG. 7(c) demonstrates the electric field strength profile of the optical mode of the prior art VCSEL of FIG. 3(a) calculated for the aperture region and the mode tilt angle of 7.5 degrees, defined for a $Ga_{0.85}Al_{0.15}As$ layer. Dashed lines connect the node points of the optical field profiles of FIG. 7(b) and FIG. 7(c) showing a good matching between the two field profiles.

FIG. 7(d) yields the refractive index profile in the aperture region of the prior art VCSEL of FIG. 3(a).

calculated for the aperture region at normal incidence, revealing a VCSEL dip in the middle of the stopband, at 850 nm, and a second feature with a low finesse at the long wavelength edge of the stopband, namely at 883 nm. Repeat of FIG. 9.

Figure 8:
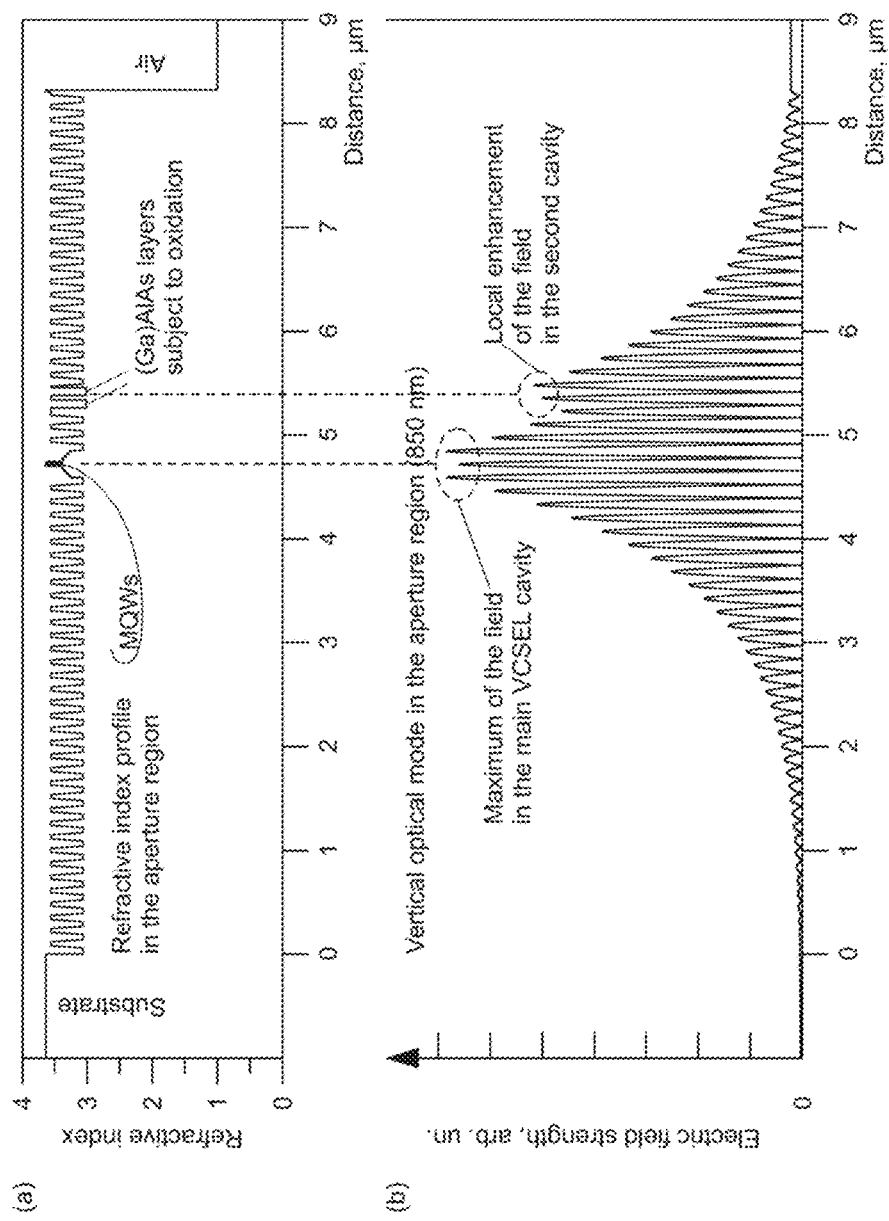
FIG. 8(a). Refractive index profile of a vertical cavity surface emitting laser (VCSEL) according to an embodiment of the present invention, the refractive index being depicted for the aperture region showing layers (Ga)AlAs subject to oxidation that are not oxidized.
FIG. 8(b). Electric field strength profile calculated for the vertical optical mode of the VCSEL structure of FIG. 8(a) in the aperture region. The profile shows the local enhancement of the optical field strength in both a first, main VCSEL cavity, and in a second cavity having a low finesse.

FIG. 11(b). Optical power reflectance spectrum of the vertical cavity surface emitting laser (VCSEL) of FIG. 8(a) calculated for the aperture region at oblique incidence at the tilt angle 16.2 degrees, the angle being defined for a $Ga_{0.85}Al_{0.15}As$ layer. The two features of FIG. 11(b) are shifted to shorter wavelengths such that the feature at the edge of the stopband at 883 nm is now at 850 nm.

FIGS. 12(a) through 12(c) compare the electric field strength profiles for the optical modes of the vertical cavity surface emitting laser (VCSEL) of FIG. 8(a), calculated for the same wavelength of 850 nm. FIG. 12(a) depicts the refractive index profile of the VCSEL structure in the aperture region.

Figure 9:
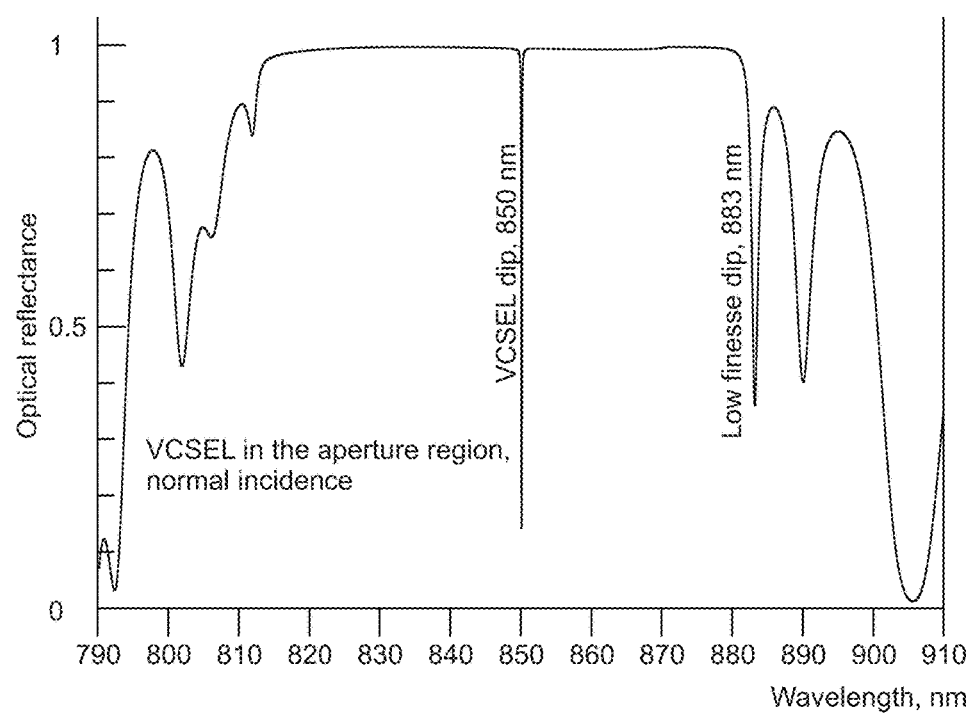
FIG. 9. Optical power reflectance spectrum of a vertical cavity surface emitting laser (VCSEL) structure, according to an embodiment of the present invention, the spectrum being calculated for the aperture region at normal incidence, revealing a VCSEL dip in the middle of the stopband, at 850 nm, and a second feature with a low finesse at the long wavelength edge of the stopband, namely at 883 nm.

FIG. 12(b) presents the electric field strength profile of the vertical optical mode of the aperture region of the VCSEL, the mode corresponding to the VCSEL dip of FIGS. 9 and 11(a).

FIG. 12(c) shows the electric field strength profile of the tilted optical mode of the aperture region of the VCSEL, the mode corresponding to the feature of the optical reflectance spectrum of FIG. 11(b) at 850 nm. Thus this is the electric strength profile of the tilted optical mode having an effective propagation angle 16.2 degrees in GaAlAs. Each of the nodes of the electric field profile of the tilted mode of FIG. 12(c) is connected by a dashed line to the nearest node of the electric field profile of the vertical mode of FIG. 12(b). The vertical mode has one extra node.

Figure 13:
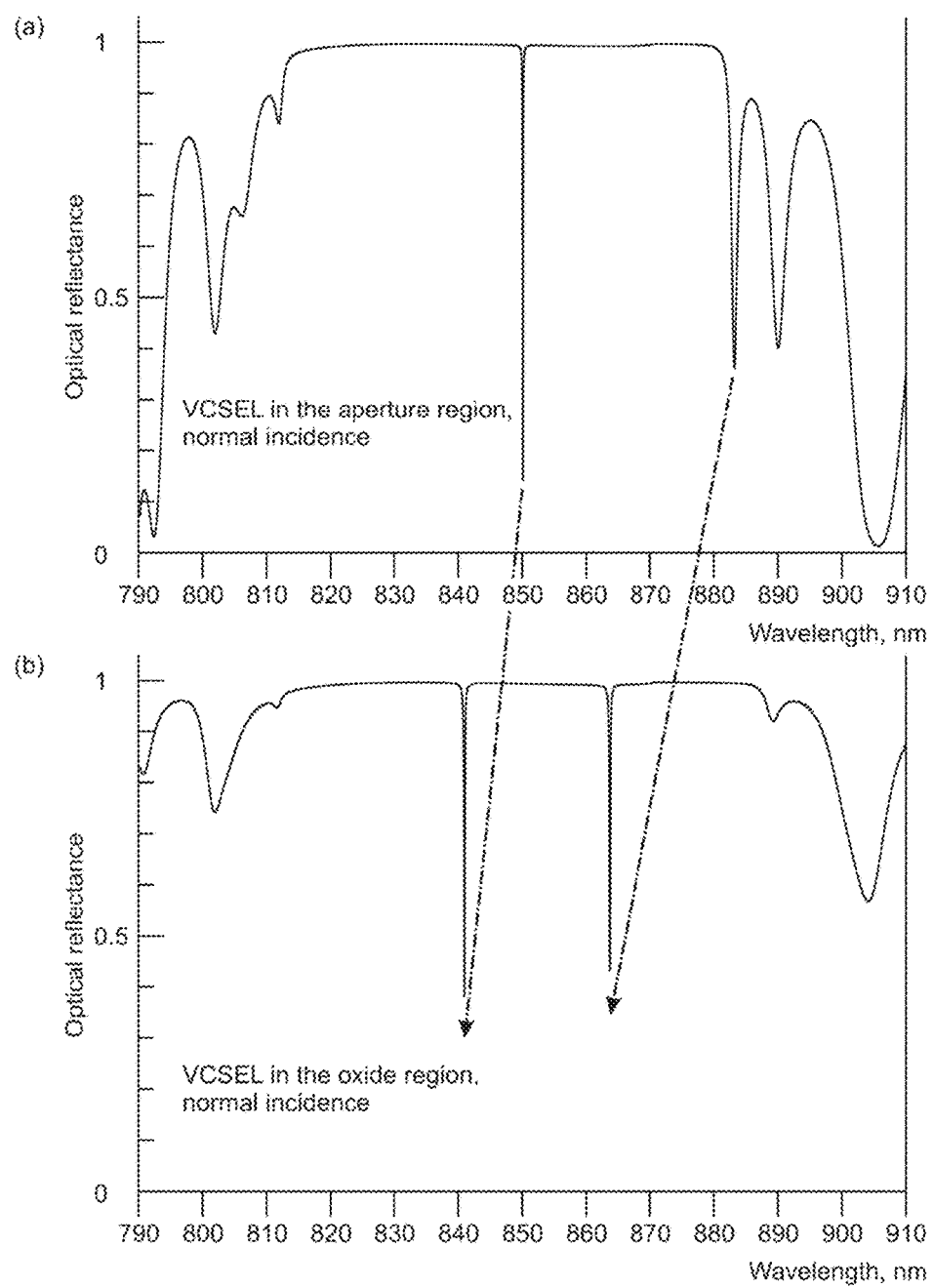

FIG. 13(a). Optical power reflectance spectrum of the vertical cavity surface emitting laser (VCSEL) structure of FIG. 8(a) calculated for the aperture region at normal incidence, revealing a VCSEL dip in the middle of the stopband, at 850 nm, and a second feature with a low finesse at the long wavelength edge of the stopband, namely at 883 nm. Repeat of FIGS. 9 and 11(a).

FIG. 13(b). Optical power reflectance spectrum of the VCSEL of FIG. 8(a), calculated for the oxide region at normal incidence, revealing two dips that are shifted towards shorter wavelengths from their spectral positions in the spectrum of FIG. 13(a) for the non-oxidized structure.

Figure 14:
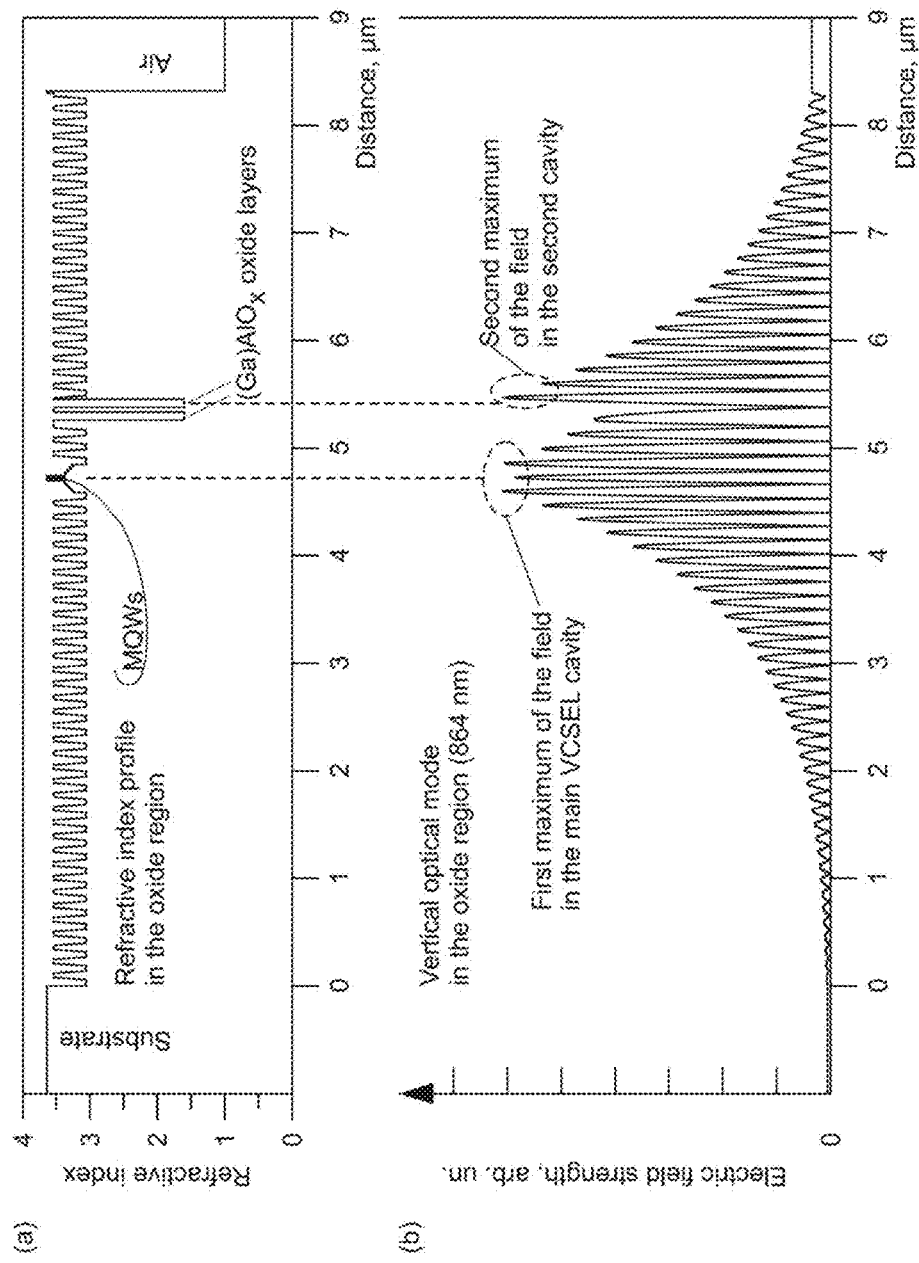

FIG. 14(a). Refractive index profile of the vertical cavity surface emitting laser (VCSEL) of FIG. 8(a)) in the oxide region, showing two oxide layers $(Ga)AlO_y$.

FIG. 14(b). Electric field strength profile of the vertical optical mode of the VCSEL structure of FIG. 8(a) calculated for the vertical structure of FIG. 9(a) in the oxide region. The optical mode reveals two local maxima in intensity, one in the active region, and one in the oxide layers showing the existence of effectively two coupled cavities.

FIG. 15(a) repeats FIGS. 9, 11(a) and 13(a) and shows the optical power reflectance spectrum at normal incidence of the vertical cavity surface emitting laser (VCSEL) structure of FIG. 8(a) in the aperture region revealing a VCSEL dip at 850 nm.

FIG. 15(b) repeats FIG. 13(b) and shows the optical power reflectance spectrum at normal incidence of the VCSEL structure of FIG. 8(a) calculated for the oxide region.

Figure 15:
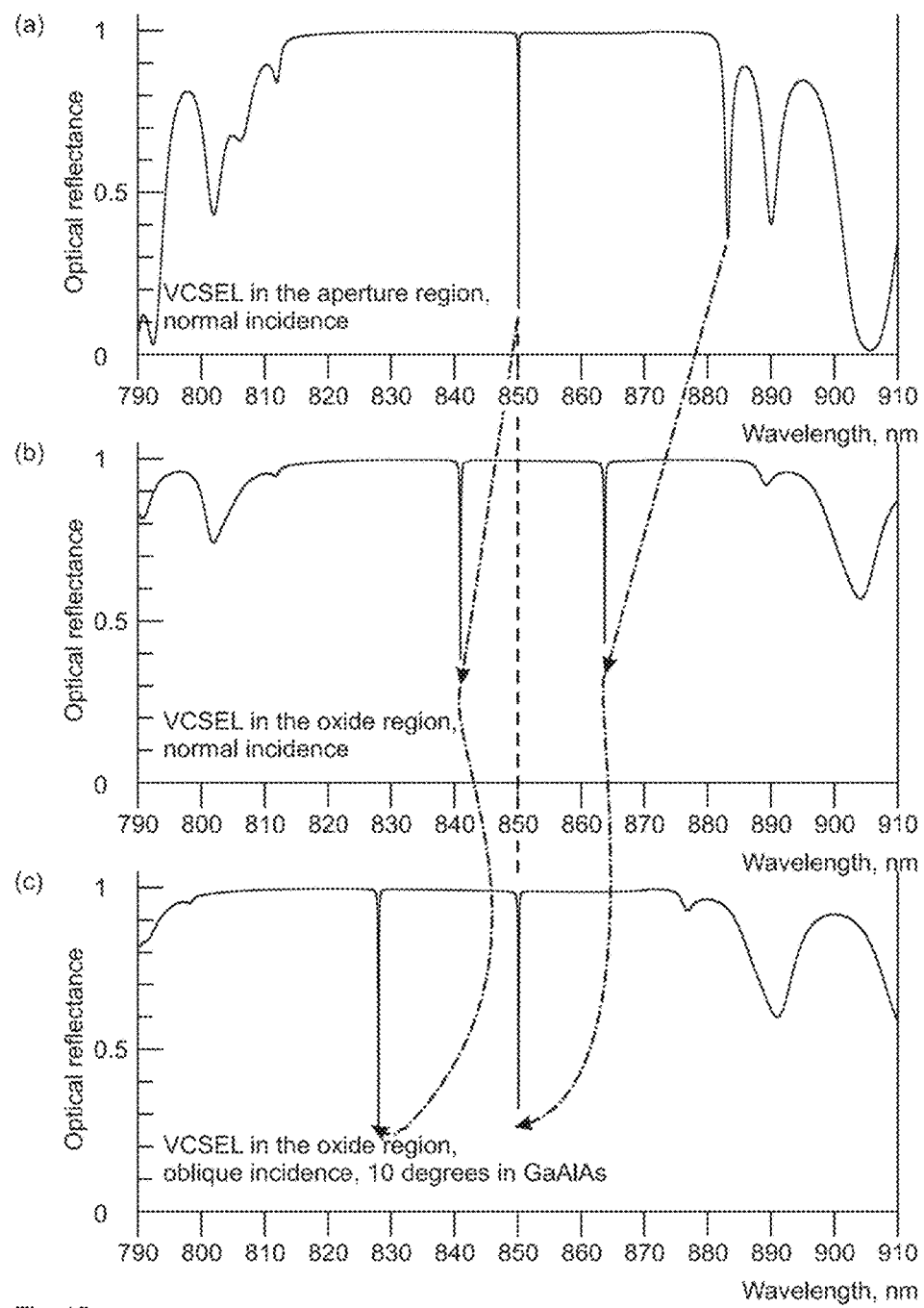

FIG. 15 (c) shows the optical power reflectance spectrum of the VCSEL structure of FIG. 8(a) calculated for the oxide region for the oblique incidence of light at the angle 10 degrees, the angle being defined for a $Ga_{0.85}Al_{0.15}As$ layer. In FIGS. 15(a) through 15(c) a double stage shift of the dips is shown. First, the two dips of the optical power reflectance spectrum of the VCSEL shift towards shorter wavelengths due to replacement of semiconductor layer or layers by oxide layer(s) having a lower refractive index. Dash-dotted tilted straight line connects the corresponding features in FIGS. 15(a) and 15(b). Second, the two dips further shift towards shorter wavelengths because of a tilt angle of incidence of light. Dash-dotted curves connect the corresponding features in FIGS. 15(b) and 15(c). The angle of incidence is chosen such that the long wavelength dip in FIG. 15(c) is positioned at 850 nm. The vertical dashed line demonstrates, that the dip in the optical power reflectance spectrum of the VCSEL structure calculated for the aperture region at normal incidence, on the one hand, and the long wavelength dip in the optical reflectance spectrum calculated for the oxide region at oblique incidence, on the other hand, coincide.

Figure 16:
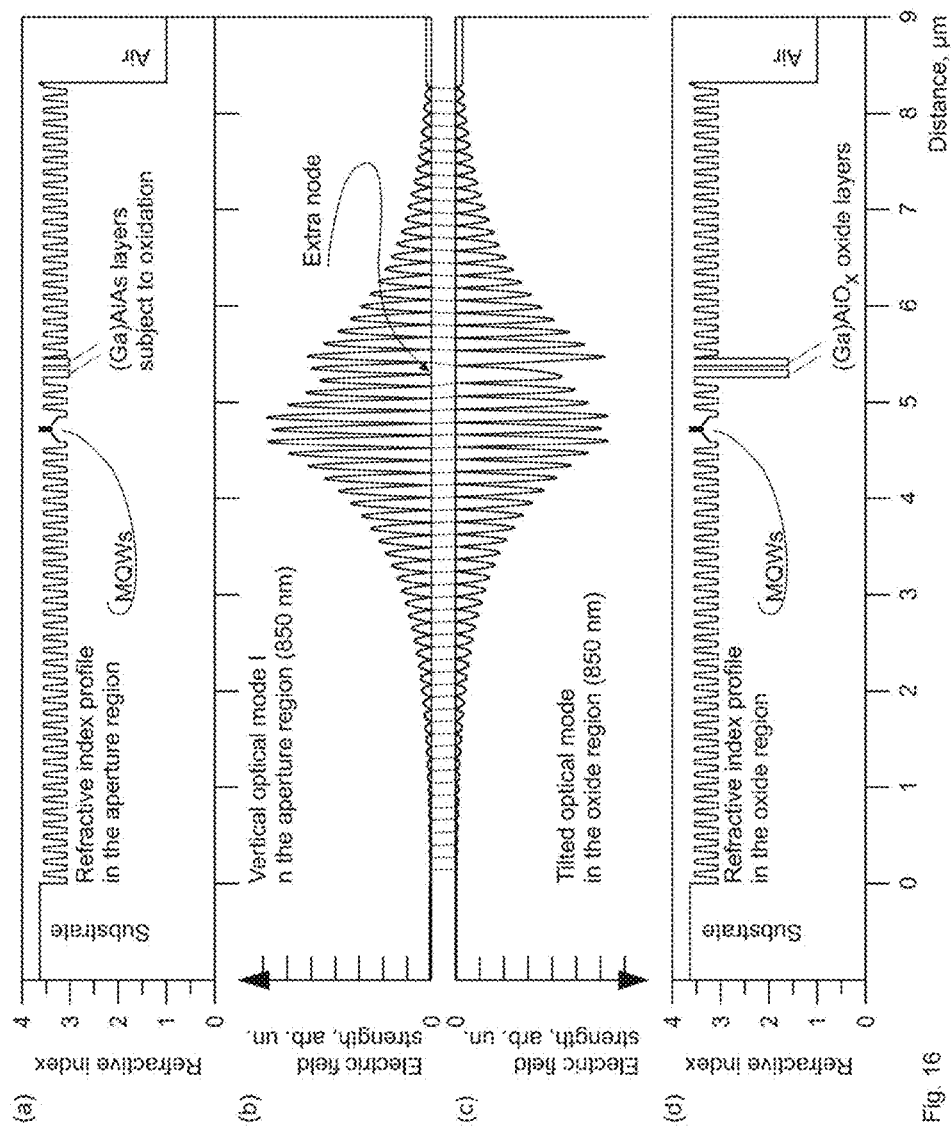

FIGS. 16(a) through 16(d) compare the electric field strength profiles for the optical modes of the vertical cavity surface emitting laser (VCSEL) of FIG. 8(a), calculated for the same wavelength of 850 nm, one mode being the vertical optical mode in the aperture region, and the other being the tilted optical mode in the oxide region. FIG. 16(a) shows the refractive index profile in the aperture region, repeating FIG. 8(a).

FIG. 16(b) depicts the electric field strength profile of the vertical optical mode of the aperture region of the VCSEL of FIG. 8(a).

FIG. 16(c) demonstrates the electric field strength profile of the optical mode of the VCSEL of FIG. 8(a) calculated for the oxide region and the mode tilt angle of 10 degrees, defined for a $Ga_{0.85}Al_{0.15}As$ layer. Each of the nodes of the electric field profile of the tilted mode of FIG. 16(c) is connected by a dashed line to the nearest node of the electric field profile of the vertical mode of FIG. 16(b). The vertical mode has one extra node.

FIG. 16(d) yields the refractive index profile in the oxide region of the VCSEL of FIG. 8(a).

Figure 3:
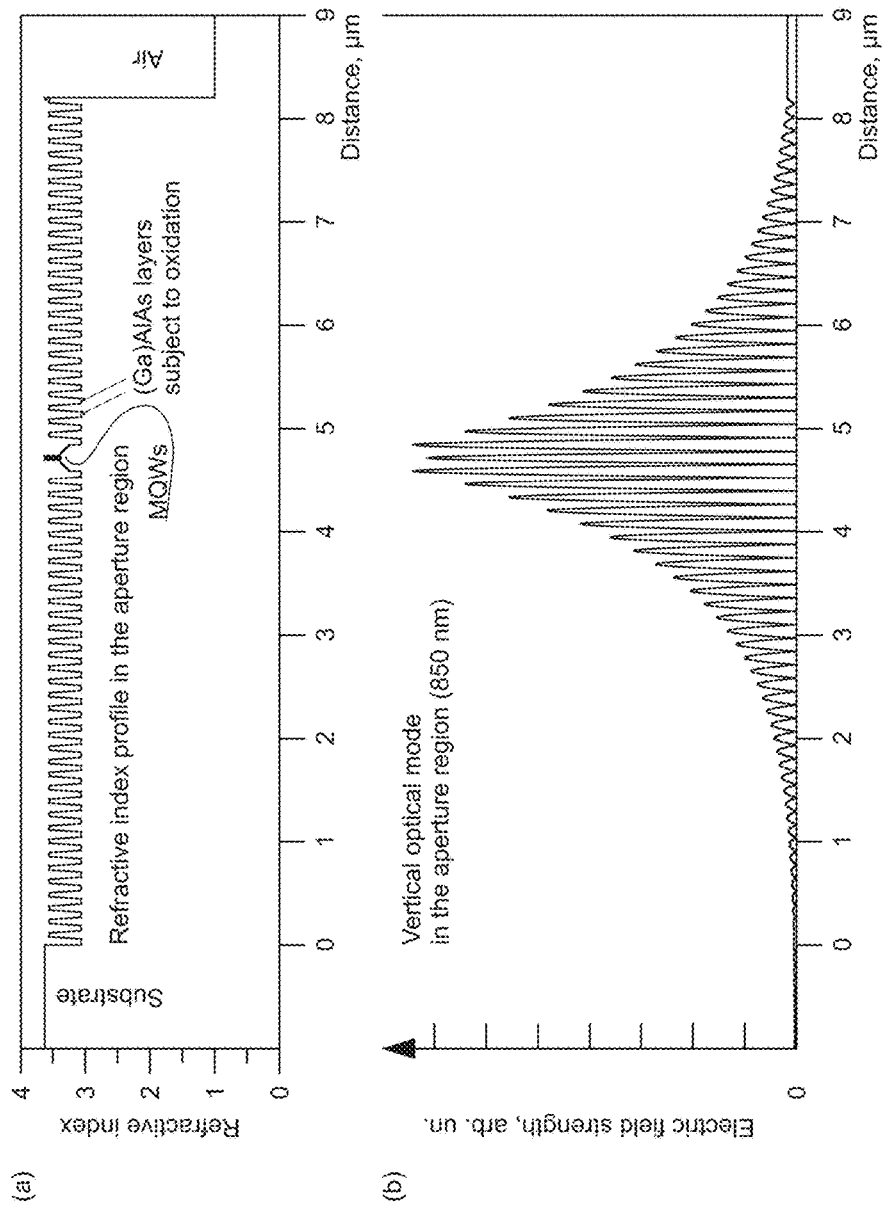
FIG. 3(a). Refractive index profile of a prior art vertical cavity surface emitting laser (VCSEL) in the aperture region showing layers (Ga)AlAs subject to oxidation that are not oxidized.
FIG. 3(b). Electric field strength profile calculated for the vertical optical mode of the prior art VCSEL structure of FIG. 3(a) in the aperture region.
Figure 4:
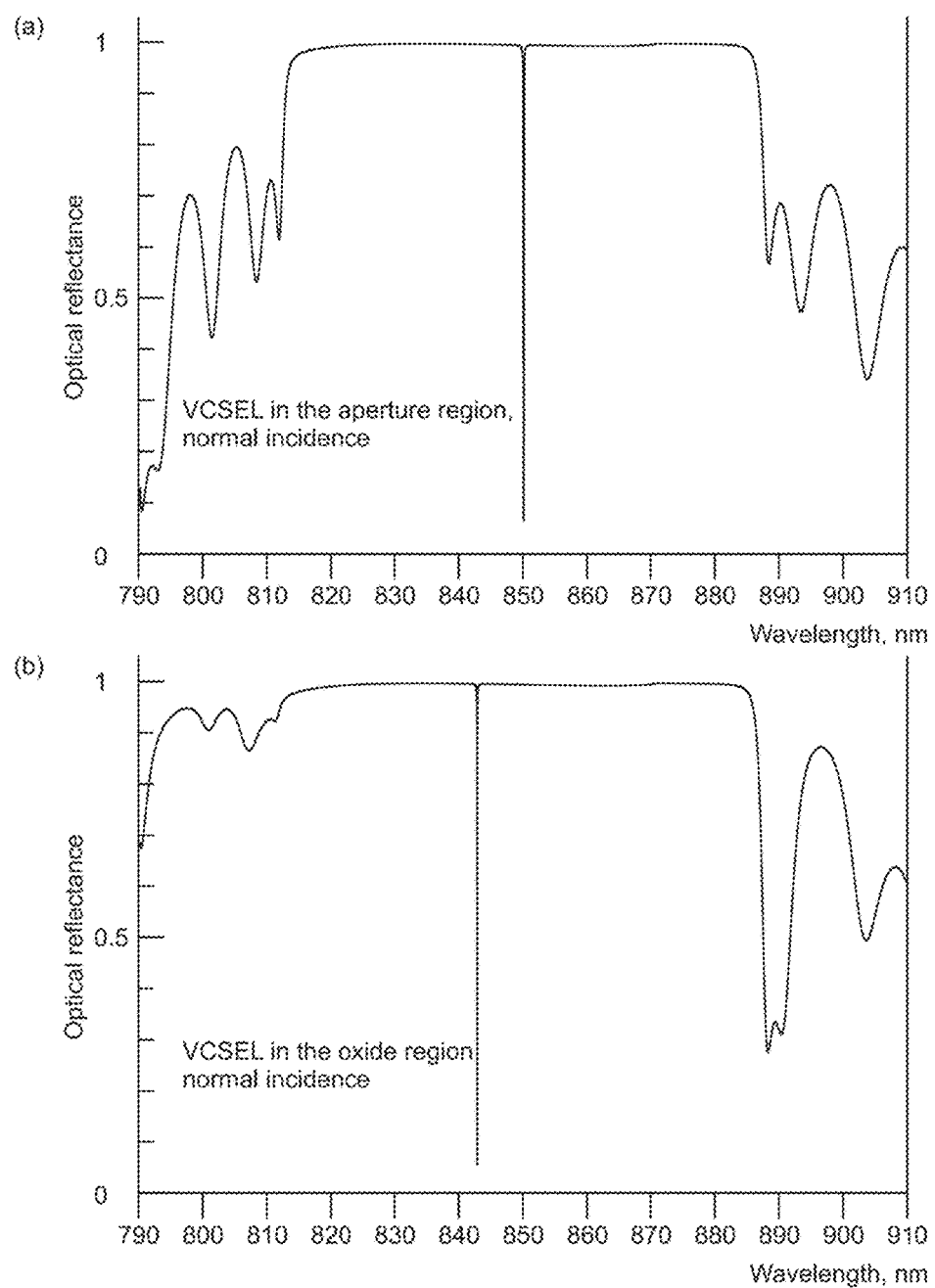
FIG. 4(a). Optical power reflectance spectrum of the prior art vertical cavity surface emitting laser (VCSEL) of FIG. 3(a) calculated for the aperture region at normal incidence, revealing a dip at 850 nm.
FIG. 4(b). Optical power reflectance spectrum of the prior art VCSEL of FIG. 3(a), calculated for the oxide region at normal incidence, revealing a dip shifted to a shorter wavelength 843 nm.
Figure 5:
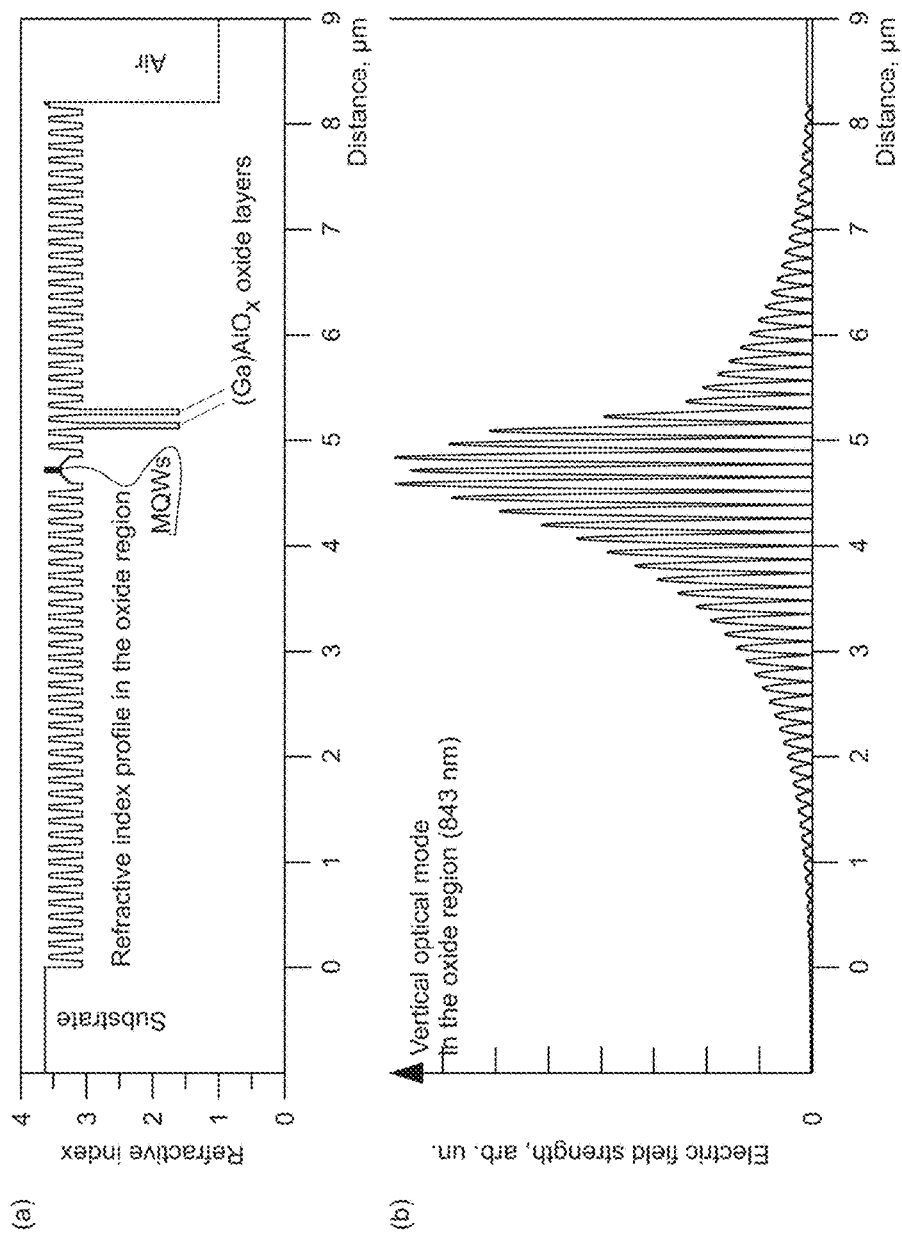
FIG. 5(a). Refractive index profile of the prior art vertical cavity surface emitting laser (VCSEL), described in FIG. 3(a) in the oxide region, showing two oxide layers (Ga)$AlO_y$.
FIG. 5(b). Electric field strength profile of the vertical optical mode of the prior art VCSEL structure calculated for the vertical optical mode of FIG. 5(a).
Figure 6:
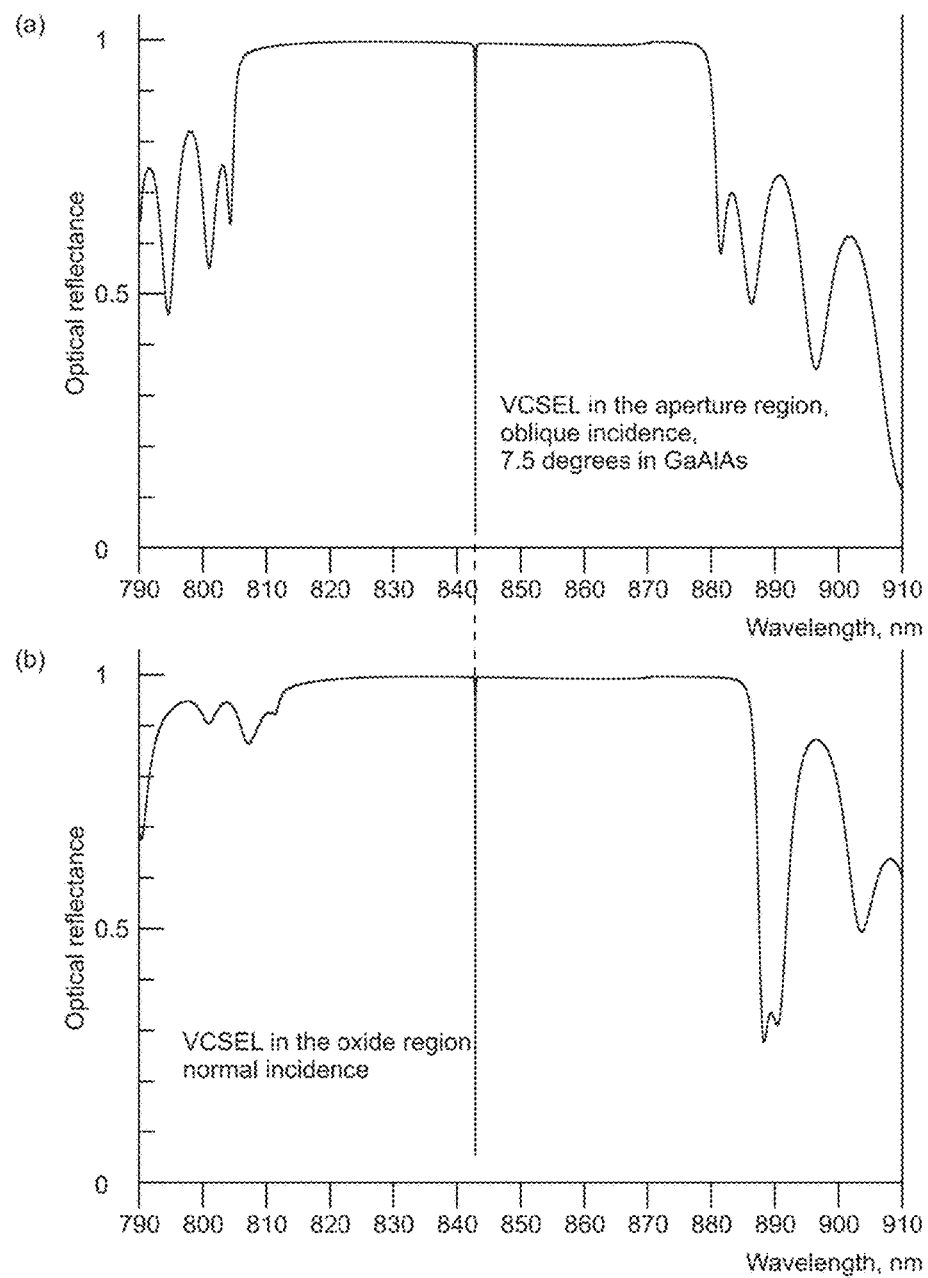
FIG. 6(a). Optical power reflectance spectrum of the prior art vertical cavity surface emitting laser (VCSEL) depicted in FIG. 3(a), calculated for the aperture region at oblique incidence, tilted by 7.5 degrees with respect to the normal to the surface, the angle being defined for a $Ga_{0.85}Al_{0.15}As$ layer, revealing a dip at 843 nm.
FIG. 6(b) repeats FIG. 4(b).
Figure 7:
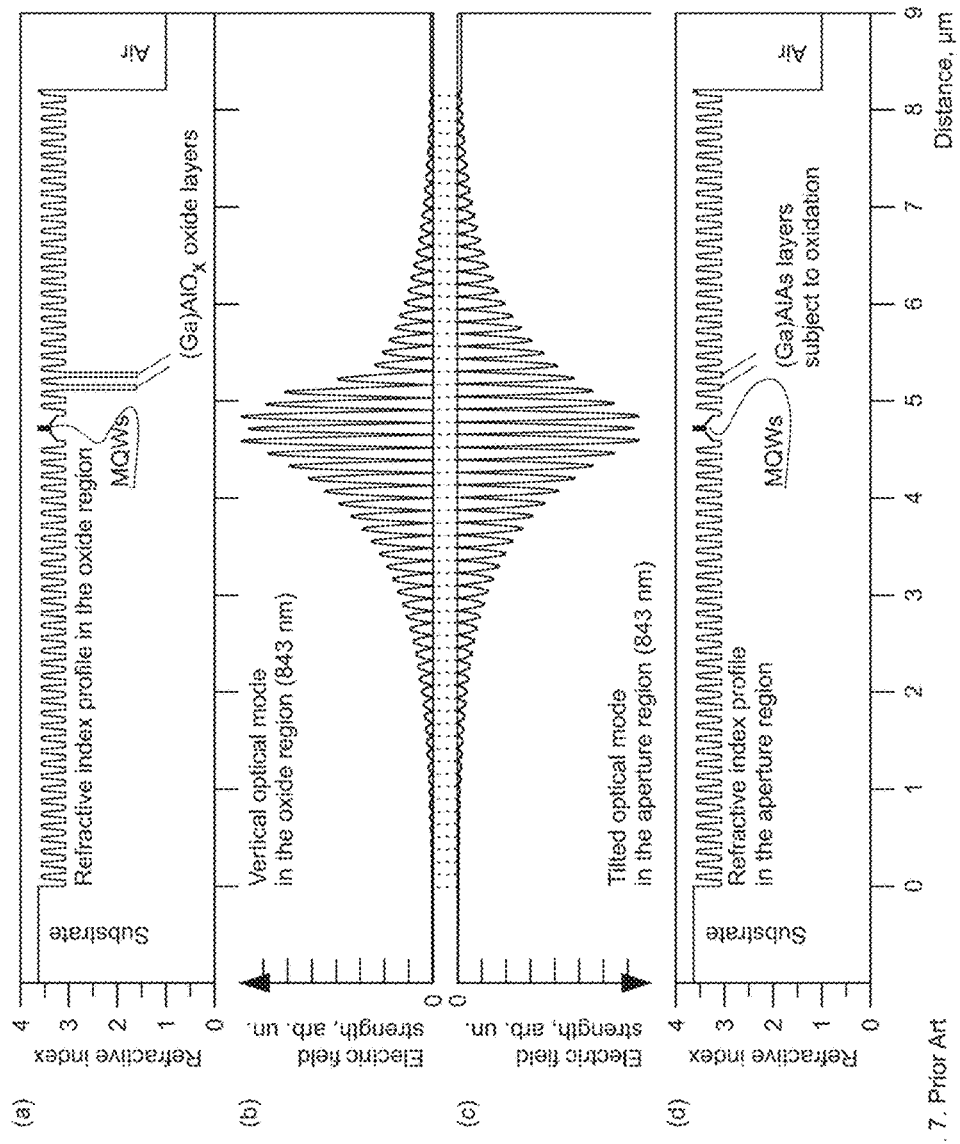
FIGS. 7(a) through 7(d) compare the electric field strength profiles for the optical modes of the prior art vertical cavity surface emitting laser (VCSEL) of FIG. 3(a), calculated for the same wavelength of 843 nm, one mode being the vertical optical mode in the oxide region, and the other being the tilted optical mode in the aperture region.
Figure 17:
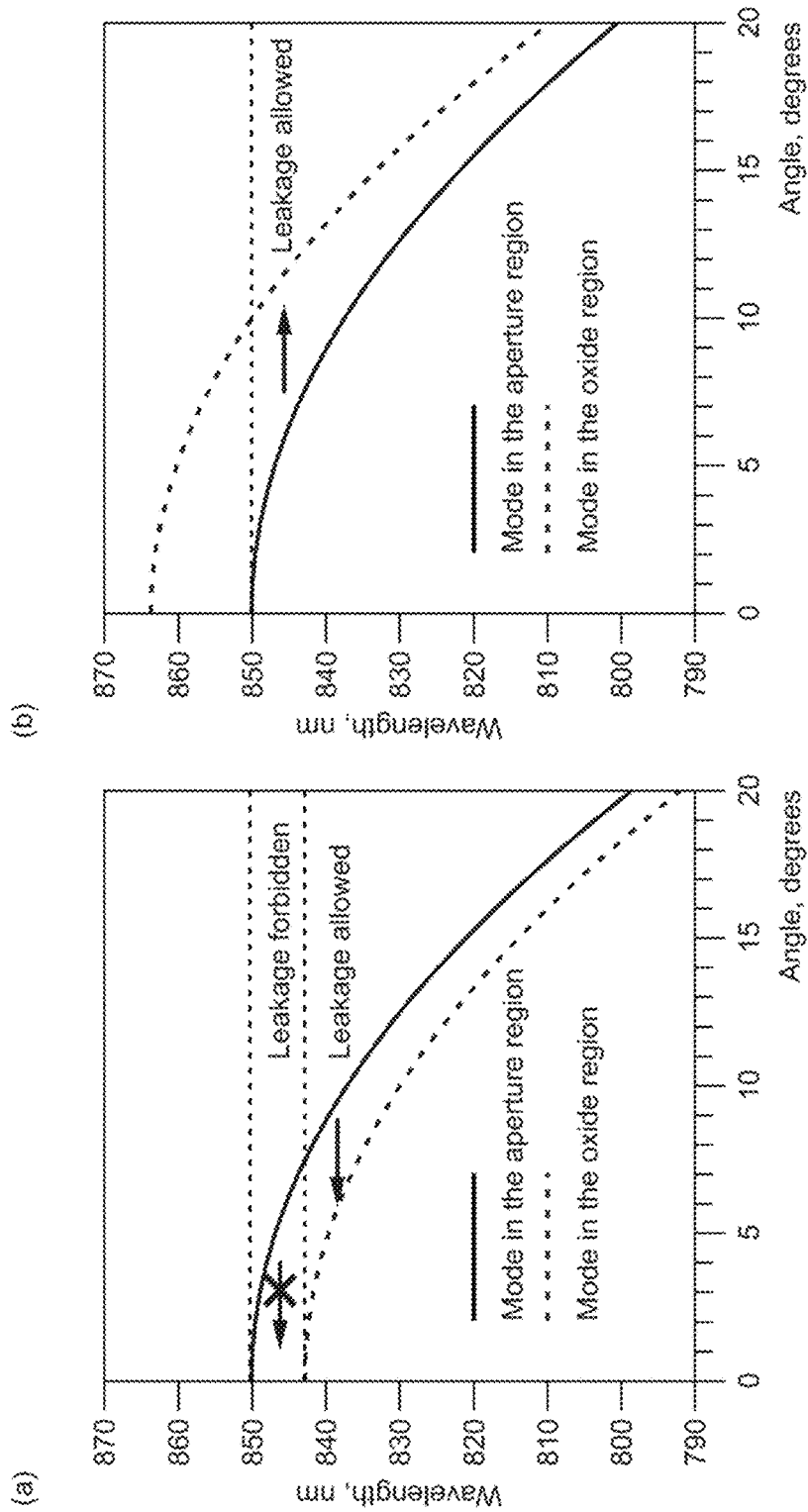

FIG. 17(a) shows the dispersion curves of the tilted optical modes calculated for the prior art vertical cavity surface emitting laser (VCSEL) of FIG. 3(a), the solid curve being calculated for the optical modes in the aperture region, and the dashed curve being calculated for the optical modes in the oxide region. Modes in the aperture regions having an effective angle below 8 degrees have no counterparts among the optical modes in the oxide region having the same wavelength. This fact implies that such modes cannot leak from the aperture regions to the surrounding areas. Only modes having a tilt angle beyond 8 degrees can leak into surrounding areas.

FIG. 17(b) shows the dispersion curves of the tilted optical modes calculated for the VCSEL of the embodiment of the present invention shown in FIG. 8(a). The solid curve is calculated for the aperture region, and the dashed curve refers to the oxide region. A key novel feature of these dispersion curves distinct from the prior art of FIG. 17(a) is the fact that the optical mode in the aperture regions, for all angles of the mode, has a counterpart optical mode at the same wavelength among the modes of the oxide region. This implies the fact that the optical modes in the aperture region always can leak to the surrounding areas.

Figure 18:
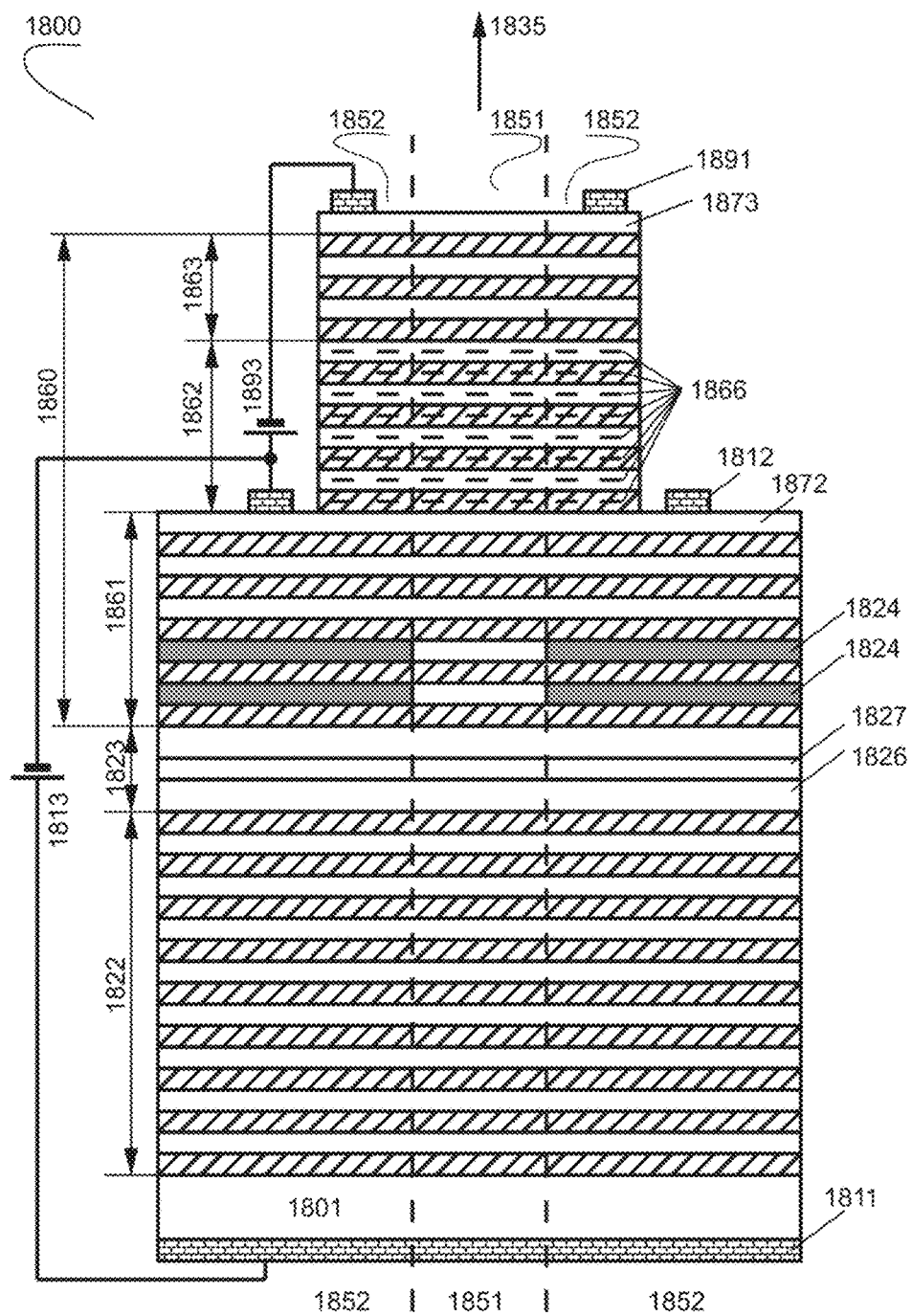

FIG. 18 shows schematically a cross-section of an electrooptically modulated vertical cavity surface emitting laser (EOM VCSEL) according to an embodiment of the present invention.

FIGS. 19(a) and 19(b) illustrate the principle of operation of the electrooptically modulated vertical cavity surface emitting laser (EOM VCSEL) of FIG. 18. Figures show the optical power reflectance spectrum of the device at a zero and at a non-zero electric field applied to the electrooptic medium. FIG. 19(a) refers to the aperture region, and FIG. 19(b) addresses the oxide region of the device, in which the shift of the spectral features is larger.

Figure 20:
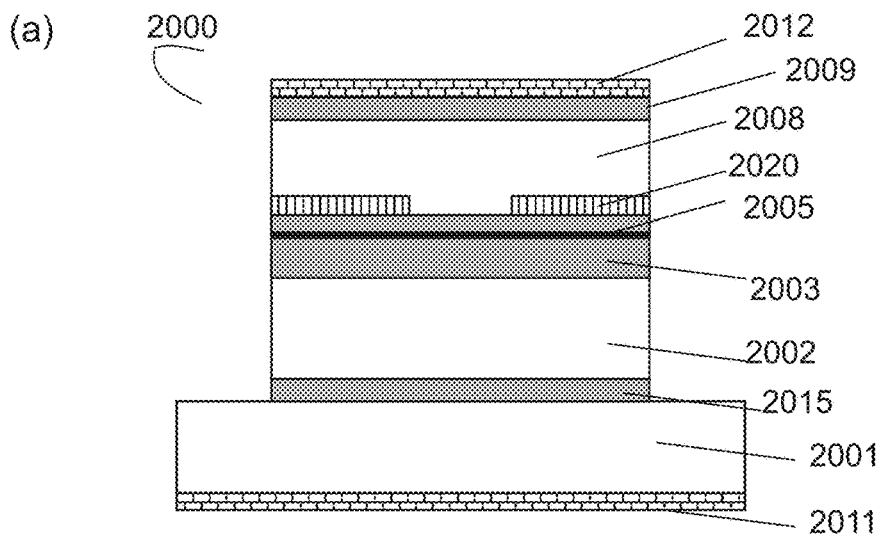
Figure 20:
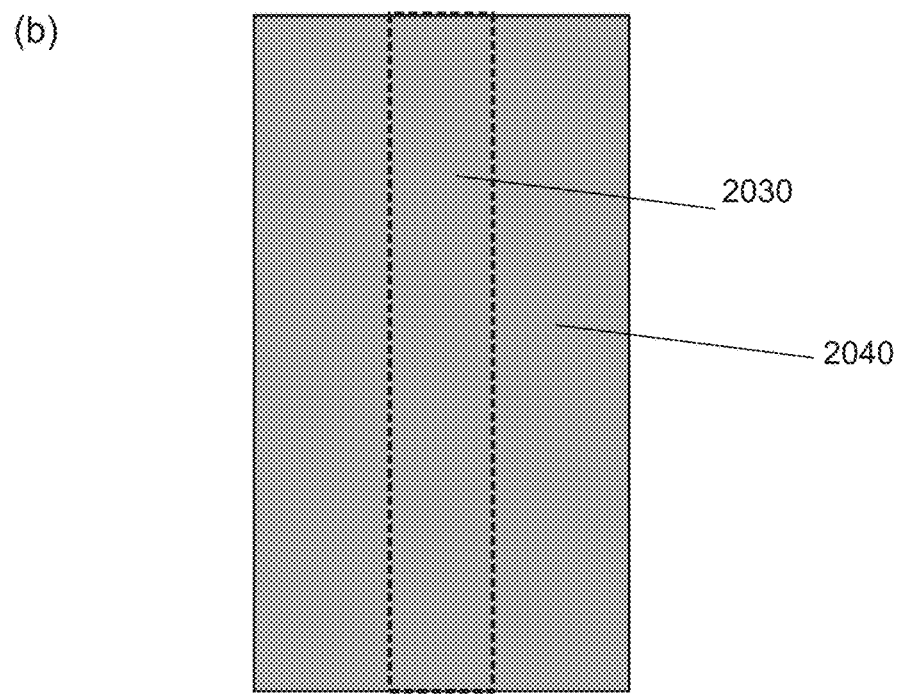

FIG. 20 (a) shows schematically a cross-section of a prior art ridge edge-emitting laser, wherein the layers of $Al_xGa_{1-x}As$ layers with a high (x>0.9) AlAs concentration are grown inside the top cladding layer, and the layers are oxidized.

FIG. 20(b) shows schematically a planar cross-section of the prior art edge-emitting laser of FIG. 18(a) showing the aperture for the flow of the current underneath non-oxidized regions of the structure.

FIG. 21(a) shows a vertical refractive index profile of the prior art edge-emitting laser in the aperture region showing $Al_xGa_{1-x}As$ layers with a high (x>0.9) AlAs concentration.

FIG. 21(b) displays the electric field strength profile of the optical mode in the aperture region of the prior art edge-emitting laser structure of FIG. 21(a).

FIG. 21(c) depicts the vertical refractive index profile of the prior art edge-emitting laser of FIG. 21(a) in the oxide region showing two oxide layers $(Ga)AlO_y$.

FIG. 21(d) shows the electric field strength profile of the optical mode in the oxide region of the prior art edge-emitting laser structure of FIG. 21(a) showing repelling of the optical mode from the oxide layers.

FIG. 22(a) shows schematically a vertical cross-section of an edge-emitting laser according to an embodiment of the present invention. The laser contains two cavities, and one or plurality layers of $Ga_{1-x}Al_xAs$ preferably inserted into the cladding layer between the two cavities, or in the second cavity (off from the active medium).

FIG. 22(b) shows schematically a planar cross-section of the edge-emitting laser of FIG. 22(a) showing the aperture for the flow of the current underneath non-oxidized regions of the structure.

FIG. 23(a) shows schematically the refractive index profile of the edge-emitting laser of the embodiment of FIG. 22(a) containing two coupled cavities. The refractive index profile corresponds to the aperture region and reveals two coupled cavities and layers of $Al_xGa_{1-x}As$ with a high (x>0.9) AlAs concentration positioned in the second cavity.

FIGS. 23(b) through 23(d) show the electric field strength profile in the three optical modes of the edge-emitting laser of FIG. 22(a) calculated for the aperture region. Only one of the three optical modes, namely mode 3 of FIG. 23(d) has a significant intensity in the active region. This mode has at the same time a weak penetration to the p-doped layers and, hence, low losses.

FIG. 24(a) shows schematically the refractive index profile of the edge-emitting laser of FIG. 22(a) containing two coupled cavities. The refractive index profile corresponds to the oxide region and reveals two coupled cavities and oxide layers of $(Ga)AlO_y$ formed in the second cavity.

FIGS. 24(b) through 24(d) show the electric field strength profile of the three optical modes of the edge-emitting laser of FIG. 22(a) calculated for the oxide region. The thicknesses of the layers are selected such that three modes are at resonance and have nearly equal intensity in the active region. This intensity is approximately 3 times weaker than that far from the resonance. Moreover, all three modes have a strong penetration in the p-doped layers and, hence, significant losses.

Figure 25:
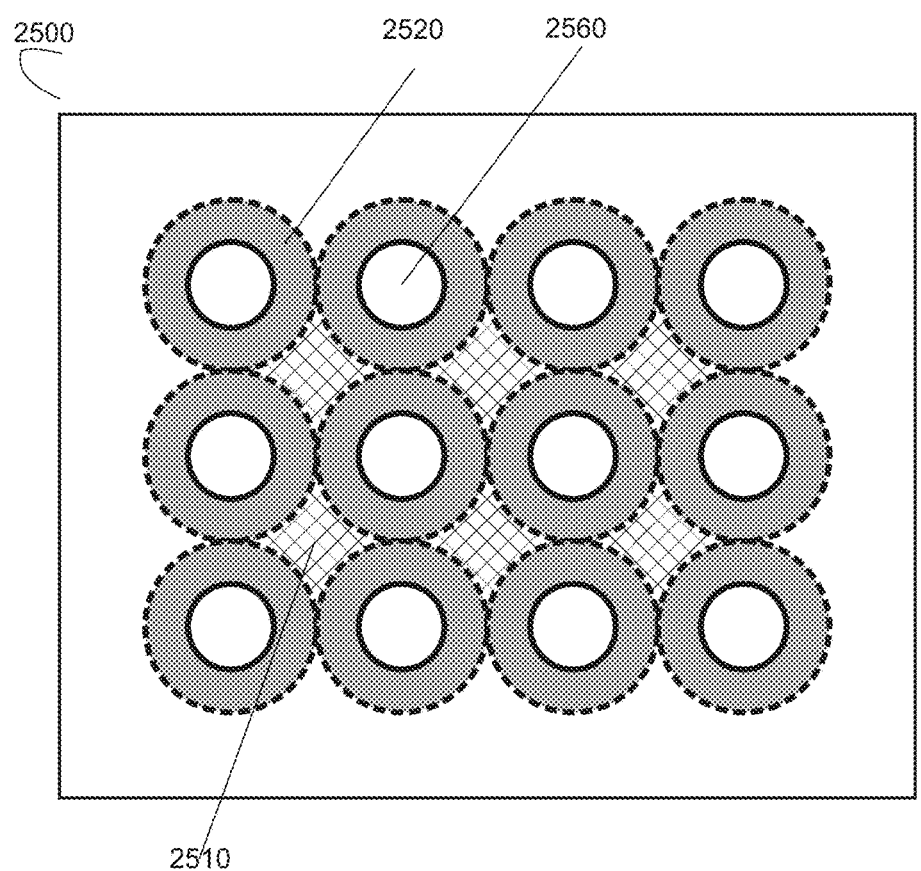

FIG. 25 shows schematically a plan view of phase-coupled array of vertical cavity surface emitting lasers (VCSELs), wherein the coupling is realized via the leakage of the optical modes from the aperture regions into the surrounding oxidized regions.

FIG. 26(a) shows schematically a plan view of phase-coupled array of vertical cavity surface emitting lasers (VCSELs), wherein the coupling is realized via the leakage of the optical modes from the aperture regions into the surrounding oxidized regions, similar to FIG. 25, and further denotes a plane for the vertical cross-section to be shown in FIG. 26(b).

FIG. 26(b) shows schematically a vertical cross-section of a phase-coupled array of vertical cavity surface emitting lasers of FIGS. 25 and 26(a), wherein this array is employed for the steering of the laser beam.

Figure 27:
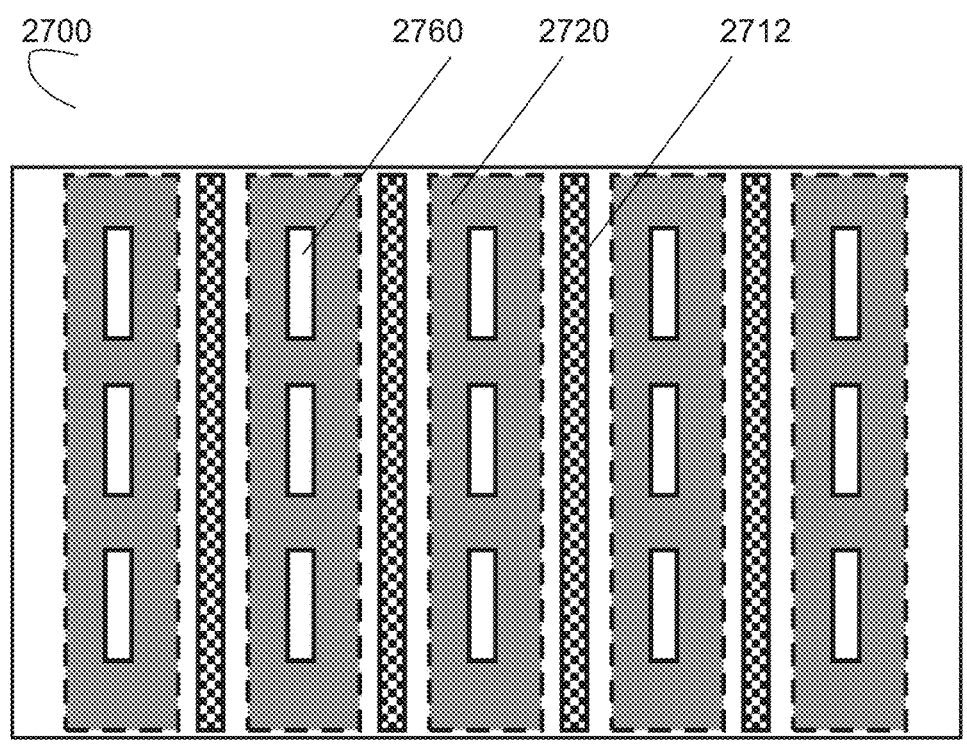

FIG. 27 shows schematically a plan view of a phase-coupled array of edge-emitting lasers (VCSELs), wherein the coupling is realized via the leakage of the optical modes from the aperture regions in the surrounding oxidized regions.

Figure 28:
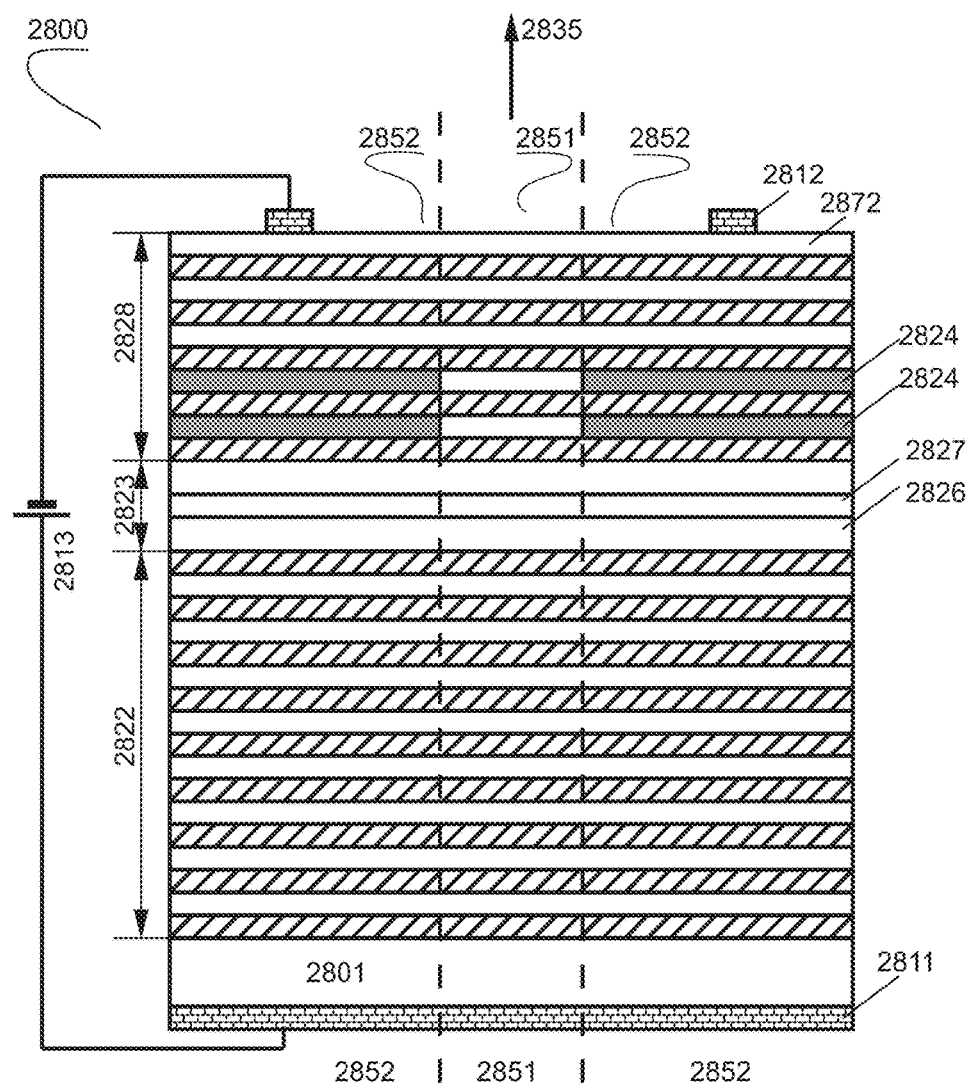

FIG. 28 shows schematically a cross-section of a vertical cavity surface emitting laser (VCSEL) according to multiple embodiments of the present invention.

DETAILED DESCRIPTION OF THE INVENTION

Figure 1:
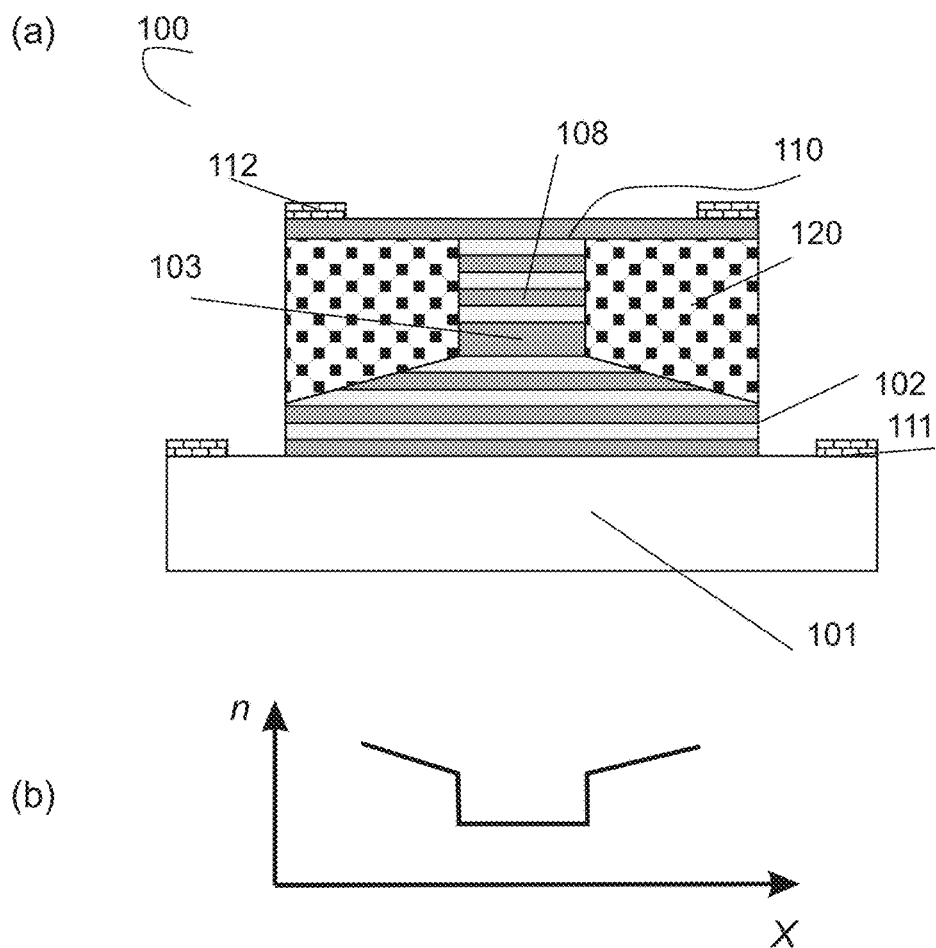
FIG. 1(a). Schematic cross-section of a prior art vertical cavity surface emitting laser (VCSEL) wherein the areas adjacent of the VCSEL mesa are overgrown by a material having refractive index higher than the refractive index of semiconductor layers.
FIG. 1(b). Schematic profile of the effective refractive index of the structure of FIG. 1(a) as a function of a lateral coordinate, the profile showing domains with higher refractive index adjacent to the VCSEL mesa.
Figure 2:
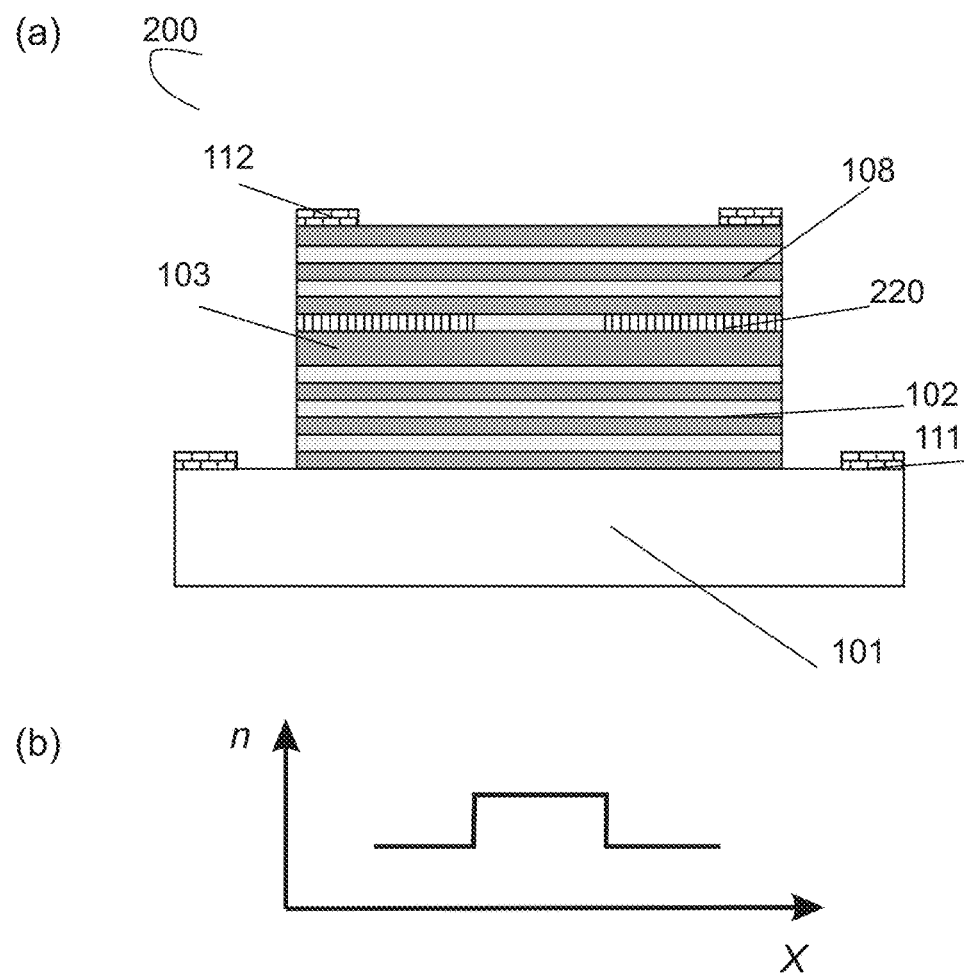
FIG. 2(a). Schematic cross-section of a prior art vertical cavity surface emitting laser (VCSEL) with the aperture bounded by an oxide layer.
FIG. 2(b). Schematic profile of the effective refractive index of the structure of FIG. 1(a) as a function of a lateral coordinate, the profile showing domains with lower refractive index in the oxidized regions.

FIG. 2(a) illustrates schematically a prior art VCSEL (200) based on $GaAs/Ga_{1-x}Al_xAs$ materials. The path of the current through the active region is determined by the current apertures. The apertures are preferably formed by deposition of the layers of AlAs or $Ga_{1-x}Al_xAs$ with Al composition x>0.9. The grown structure is subject to oxidation during which the layers AlAs ($Ga_{1-x}Al_xAs$) transform into amorphous layers of oxides $AlO_y$ ($Ga_{1-x}Al_xO_y$) (220). The oxides have the refractive index approximately equal to 1.6 which is significantly lower than the refractive indices of all semiconductor layers. Thus the refractive index averaged in the vertical direction and being plotted as a function of a lateral coordinate can be schematically depicted as in FIG. 2(b). The domains with low refractive index are generally considered to form effective barriers for light effectively repelling optical modes from the oxide layers.

The effect of oxide layers on the optical modes of a prior art VCSEL is illustrated in FIGS. 3 through 7. FIG. 3(a) shows the refractive index profile of a prior art VCSEL. The distributed Bragg reflectors are formed of alternating λ/4 layers of higher refractive index (lower Al content) and lower refractive index (higher Al content). Two neighboring λ/4 layers having a lower refractive index (higher Al content) contain layers of $AlAs/(Ga_{1-x}Al_xAs$, x>0.9). FIG. 3(a) shows schematically a refractive index profile in the vertical direction in the aperture region, i.e. in the region, where the layers of $AlAs/(Ga_{1-x}Al_xAs$, x>0.9) subject to oxidation, are not oxidized. FIG. 3(b) demonstrates the electric field strength profile of the vertical optical mode of the VCSEL structure of FIG. 3(a). One should note that here and through the remainder of the specification, optical modes are illustrated by plotting the electric field strength profile, and not the intensity profile. Furthermore, the focus is given on TE optical modes. A one skilled in the art will appreciate, that TM optical modes can be considered in a similar way by considering the magnetic field strength. FIG. 4(a) depicts the optical power reflectance spectrum of the prior art VCSEL structure of FIG. 3(a) calculated for the normal incidence of light. The spectrum reveals a dip at 850 nm.

FIG. 4(b) demonstrates the optical power reflectance spectrum of the prior VCSEL structure in the oxide regions. A one skilled in the art will appreciate that, once a layer of pure AlAs or $Ga_{1-x}Al_xAs$ with x>0.9 is oxidized, an adjacent layer of $Ga_{1-x}Al_xAs$ which is in immediate contact with the oxidized layer and has a sufficiently high Al content, say 0.9, will also be oxidized. Thus, in our consideration we assume that the entire two λ/4 layers that include special layers inserted for the oxidation will be oxidized. The optical power reflectance spectrum calculated under these assumptions is shown in FIG. 4(b). The spectrum reveals a dip at a shorter wavelength, namely close to 843 nm. A shift of the dip to shorter wavelengths can be straightforward explained by replacement of semiconductor layers having a refractive index close to 3, by oxide layers having a lower refractive index 1.6.

FIG. 5(a) displays the vertical profile of the refractive index in the oxide region of the structure. Two periods of the top DBR contain now oxide layers with the refractive index 1.6. FIG. 5(b) shows the electric field strength profile of the vertical optical mode in the oxide region of the structure. The two oxide layers having a significantly lower refractive index than the rest of the structure act as a barrier repelling the optical mode.

It is worth making a certain definition of the terms. It will be appreciated by a one skilled in the art that the optical modes in a planar multilayer structure (infinitely extended in the plane of the layers) the modes can be characterized by the wave vector in the plane of the layers. Let the plane of the layers be the (xy) plane, and the vertical direction be the z-direction. For a TE optical mode, having the wave vector in the lateral plane directed in the x-direction, $\vec{k}=(k_x,k_y)=(k_x,0)$, the electric field strength of an i-th optical mode equals $$E_y^{(i)}(x,y,z)=E_y^{(i)}(z)\exp(ik_xx). \quad (1)$$

The wavelength of the mode (1) as a function of the wave vector forms a continuous spectrum, $$\lambda^{(i)}=\lambda^{(i)}(k_x). \quad (2)$$

An alternative way of characterizing the optical modes includes characterizing them via tilt angle θ defined for a certain layer. Let us fix a transparent layer with the refractive index $n_0$. Then the profile of the optical mode in this layer will be either a combination of two travelling waves (travelling to the positive and negative z-directions, respectively, $$E_y^{(i)}(z)=A\exp(ik_zz)+B\exp(-ik_zz), \quad (3a)$$

or a combination of two evanescent waves, i. e. of an increasing and decreasing exponents, $$E_y^{(i)}(z)=C\exp(\kappa z)+D\exp(-\kappa z). \quad (3b)$$

To define an angle, we choose a layer, in which the electric field has a form of Eq. (3a). The dispersion relation for this layer connects both components of the wave vector, $$k_x^2+k_z^2=n_0^2\left(\frac{\omega}{c}\right)^2, \quad (4)$$

where ω is the frequency of light, and c is the velocity of light. The electric field (1) dependent on two coordinates can be written as a sum of two travelling waves, $$E_y(x,y,z)=A\exp(ik_xx+ik_zz)+B\exp(ik_xx-ik_zz), \quad (5)$$

These are travelling waves at the directions tilted at the angles ±θ with respect to the vertical, i.e. z-direction, where the angle is defined by $$\sin\vartheta = \frac{c}{n_0\omega}k_x. \quad (6)$$

Then the dispersion relation (2) for the wavelength of the optical mode can be rewritten as $$\lambda^{(i)}=\lambda^{(i)}(\theta). \quad (7)$$

The optical mode having $k_x=0$ (or, what is the same, θ=0) are usually termed vertical mode of the multilayer structure, The optical modes having $k_x\neq 0$ (or, what is the same, θ≠0) are called tilted modes. Each vertical mode is accompanied by a continuum spectrum (2) (or (7)) of tilted modes. The profile of the optical field in the vertical direction is, in general, also a function of $k_x$ (or, of the angle θ), $$E_y^{(i)}(z)=E_y^{(i)}(z;\theta), \quad (8)$$

However, the dependence (8) on θ can be in many practical structures rather weak.

Once the structure is no longer infinitely extended in the plane of the layers, but is confined (e.g. by a mesa, as in practical VCSELs), the continuum spectrum (2) (or (7)) transforms into a discrete spectrum of lateral modes, which are lateral modes connected with the given vertical mode. If the lateral size of such mesa significantly exceeds the wavelength of the light in the material, the spectrum of the lateral modes is a quasi-continuum spectrum.

In the remainder of the specification, the terms "vertical mode" and "tilted mode" are related to the spatial profiles of these modes in the vertical, i.e. z-direction.

The wavelength of the mode (2), (7) propagating not in the vertical direction, but at a tilt angle to the vertical direction is generally shifted towards shorter wavelengths. Correspondingly, the dip in the optical power reflectance spectrum is also shifted towards shorter wavelengths. FIG. 6(a) shows the optical power reflectance spectrum of the prior art VCSEL of FIG. 3(a) calculated for the aperture region for oblique incidence of light at a tilt angle 7.5 degrees. The tilt angle is defined for the light impinging on the structure from a layer with a low Al content, $Ga_{0.85}Al_{0.15}As$. The tilt angle is selected such that the optical power reflectance spectrum of the structure in the aperture region calculated for the tilt light has a dip exactly matching the other dip, the one of the spectrum of FIG. 4(b), also repeated in FIG. 6(b), calculated for the normal incidence of light in the oxide region.

Figures from 7(a) through 7(d) compare the electric field strength profiles of the optical modes having the same wavelength, but existing in the aperture region, on the one hand, and in the oxide region, on the other hand. FIG. 7(a) shows the vertical profile of the refractive index in the oxide region, repeating FIG. 5(a). FIG. 7(d) shows the vertical profile of the refractive index in the aperture region repeating FIG. 3(a). FIG. 7(b) represents the electric field strength profile of the vertical optical mode in the oxide region. FIG. 7(c) displays the electric field strength profile in the vertical direction of the tilted optical mode in the aperture region. For better visualization, FIG. 7(c) is inverted. The dashed lines connect the nodes of the optical field of FIG. 7(b) with the corresponding nodes of the optical field of FIG. 7(c) showing that the number of the nodes is exactly the same and that the positions of the nodes nearly match. This fact implies that the optical modes in the aperture region having the wavelength λ can leak from the aperture region to the neighboring oxide region, if there exists an optical mode with the same wavelength λ in the oxide region.

FIG. 17(a) display two dispersion curves (wavelength versus angle) for the optical modes of the prior art VCSEL structure, one curve being calculated for the aperture region, shown as a solid curve, and the second curve being calculated for the oxide region, shown as a dashed curve. It is seen from FIG. 17(a) that the optical modes in the aperture region having the propagation angles between 0 and 7.5 degrees, and, correspondingly, wavelengths between 850 nm and 843 nm, do not have counterparts with the same wavelength in the oxide regions. Such modes are localized in the aperture region and cannot leak to the oxide region. The optical modes in the aperture region having propagation angles exceeding 7.5 degrees and, correspondingly, wavelengths shorter than 843 nm, can leak to the oxide region.

Figures from 8 through 16(d) and FIG. 17(b) explains distinctly different optical properties of a disclosed vertical cavity surface emitting laser, according to embodiments of the present invention.

The approach used in an embodiment of the present invention includes configuring a distributed Bragg reflector (DBR) with different positioning and thicknesses of the layers of AlAs/(Ga$_{1-x}$Al$_x$As, x>0.9) obeying the following two conditions. First, these layers in the aperture (non-oxidized) region form a part of a DBR contributing to a conventional oscillatory decay of the vertical optical mode in the DBR. No additional cavity forms in this part of structure. Second, these layers, being oxidized, form a second cavity in the oxide region of the structure, which is in resonance with the first cavity. Then different optical modes evolve in the oxide region, which are localized or partially localized at the oxide layers.

A possible way of the formation of such feature includes, but is not limited to creation of a structural element which is converted, upon oxidation, from a part of a distributed Bragg reflector, to a second cavity. Such structural element contains one or plurality of layers having a low Al content, the index being $n^{low\ AlAs}$, the total thickness being $d^{low\ AlAs}$ and one or plurality of layers having a high Al content, preferably >0.9, the index being $n^{high\ AlAs}$ the total thickness being $d^{high\ AlAs}$ In the aperture region, the effective optical thickness of this element equals an odd number of quarter wavelengths, $$n^{low AlAs} d^{low AlAs} + n^{high AlAs} d^{high AlAs} = (2m+1)\frac{\lambda}{4}, \quad (9)$$

m being an integer number. The layers with a high Al content will form, after oxidation, the oxide layers of (Ga)AlO$_y$, having the refractive index $n^{oxide}$. The effective optical thickness of this structural element could preferably be equal an integer number of half wavelengths, or, the same, an even number of quarter wavelengths, $$n^{low AlAs} d^{low AlAs} + n^{oxide} d^{high AlAs} = 2p\frac{\lambda}{4}, \quad (10)$$

p being an integer number. A strong difference in refractive indices between the oxide layers and the semiconductor layers (approximately by a factor of 2, i.e. 1.6 versus 3) gives a possibility that the criteria (9) and (10) can be met at small numbers m and p ensuring a reasonably thin structural element. Further, a one skilled in the art will appreciate that defining only the thicknesses of the layers constituting this structural element is not sufficient to promote the element operating as targeted. One needs to calculate the optical power reflectance spectra and the optical mode profiles to ensure that the requirements are met.

In another embodiment of the present invention, an element of the structure containing layers with Al content subject to oxidation forms a second cavity. Preferably this second cavity is a low-finesse cavity. FIG. 8(a) shows the refractive index profile of a VCSEL of this embodiment of the present invention. FIG. 8(b) displays the electric field strength profile of the vertical optical mode of the structure of FIG. 8(a). The profile contains a maximum of the electric field strength at the main VCSEL cavity containing the active region. Apart of this, the electric field strength profile contains a local enhancement at the second low-finesse cavity.

FIG. 9 shows the optical power reflectance spectrum of the structure of FIG. 8(a) calculated for the normal incidence of light. The spectrum contains a typical narrow dip approximately in the middle of the stopband (slightly shifted), at 850 nm. Apart of it, the spectrum contains a second feature, at the long wavelength edge of the stopband, at 883 nm. This feature is a second, low-finesse dip. A one skilled in the art will appreciate that this second, low-finesse dip is a manifestation of a second, low-finesse cavity that localizes its own optical mode.

Figure 10:
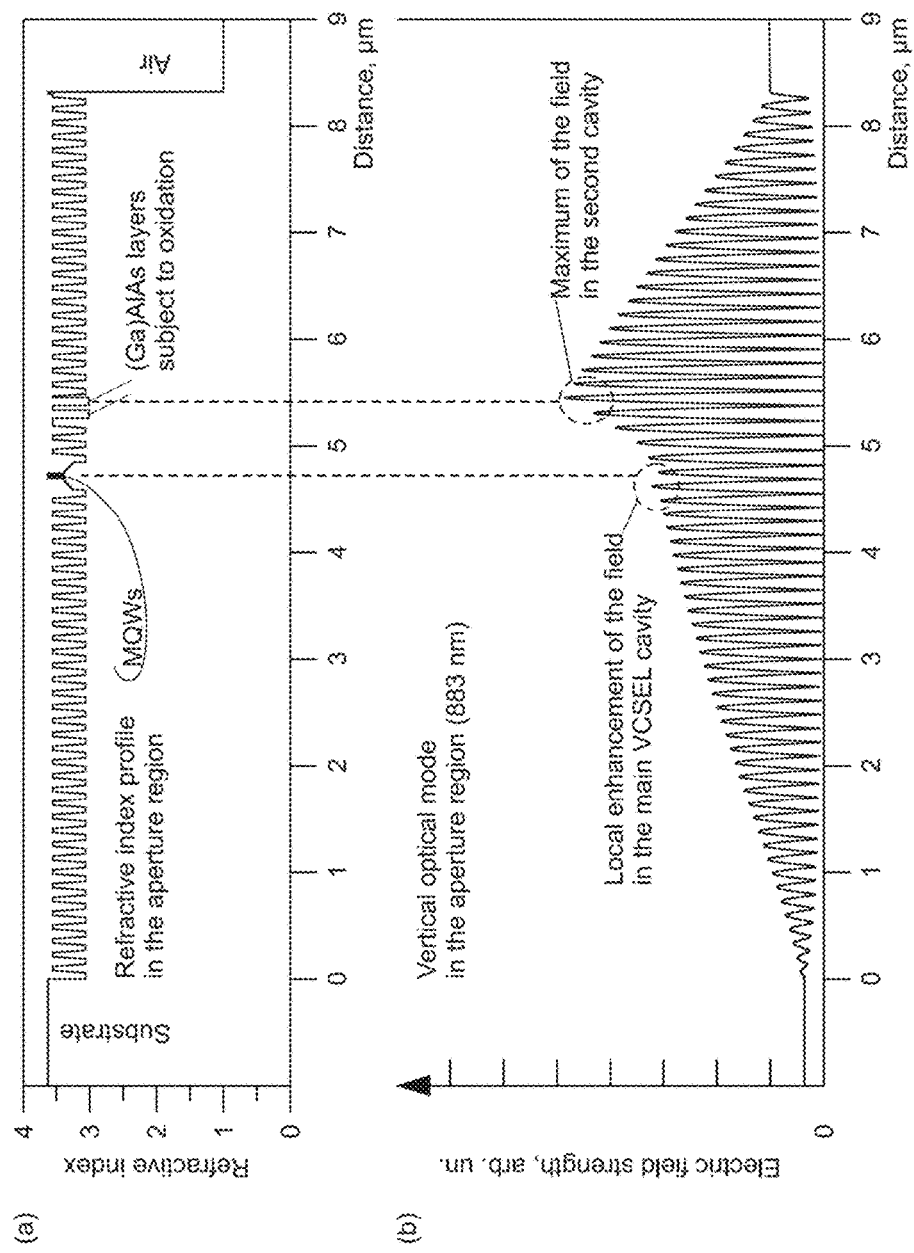
FIG. 10(a). Refractive index profile of a vertical cavity surface emitting laser (VCSEL) according to an embodiment of the present invention, the refractive index being depicted for the aperture region showing layers (Ga)AlAs subject to oxidation that are not oxidized. Repeat of FIG. 8(a).
FIG. 10(b). Electric field strength profile calculated for the vertical optical mode of the VCSEL structure of FIG. 8(a) in the aperture region, corresponding to the low-finesse dip at 883 nm.

FIGS. 10(a) and 10(b) demonstrate the vertical mode associated with this second cavity. FIG. 10(a) repeats the refractive index profile shown in FIG. 8(a). FIG. 10(b) displays the electric field strength profile of the vertical optical mode of the structure calculated for the wavelength of light 883 nm. The profile reaches its maximum value at the second cavity and exhibits a local enhancement of the intensity at the main VCSEL cavity. It is worth noting that the electric field strength at both exits of the structure, both in the air and in the substrate has a larger value than the corresponding values of the optical mode of FIG. 8(b). This confirms once again that the second cavity is a low-finesse cavity.

Figure 11:
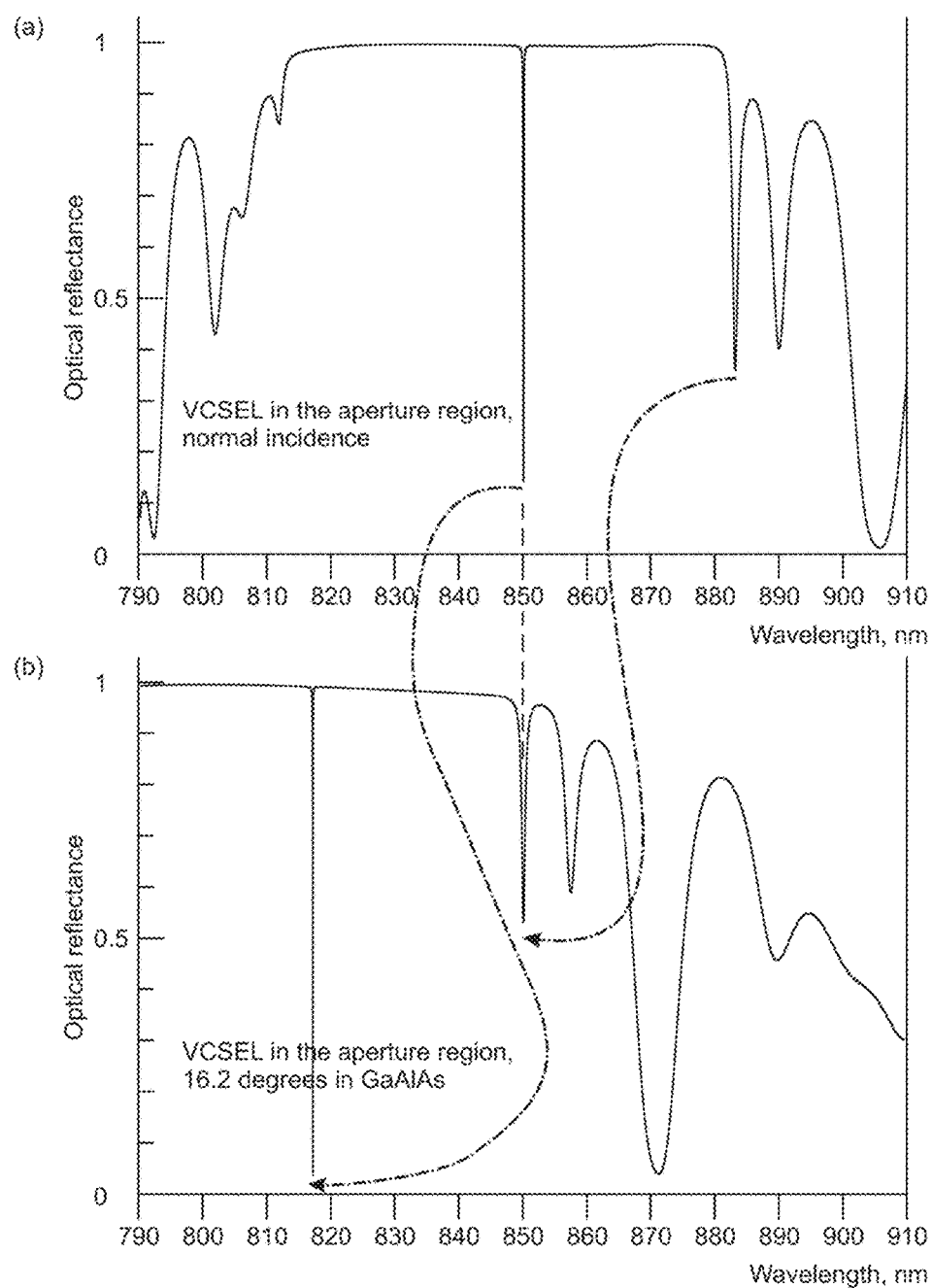
FIG. 11(a). Optical power reflectance spectrum of the vertical cavity surface emitting laser (VCSEL) of FIG. 8(a)

FIG. 11 demonstrates the change of the optical power reflectance spectrum of the structure of FIG. 8(a) at oblique incidence of light. FIG. 11(a) shows the optical power reflectance spectrum calculated for the normal incidence of light, repeating FIG. 9. FIG. 11(b) displays the spectrum calculated for the tilt angle 16.2 degrees defined in the layer Ga$_{0.85}$Al$_{0.15}$As. The angle is selected such that the second low finesse dip of the spectrum, positioned at 883 nm for the normal incidence, now hits the wavelength 850 nm. The corresponding shift is shown by a dashed-dotted curve. The main VCSEL dip at 850 nm for the normal incidence of light also exhibits a shift towards shorter wavelengths, namely to the wavelength of 817 nm.

A one skilled in the art will appreciate that the optical mode localized at the second cavity, which at 883 nm is a vertical optical mode, will also exist at the wavelength 850 nm, at which this mode will be a tilted optical mode having the tilt angle in the layers Ga$_{0.85}$Al$_{0.15}$As equal to 16.2 degrees. FIGS. 12(a) through 12(c) compare the two optical modes of the VCSEL structure calculated at the same wavelength 850 nm. FIG. 12(a) shows the refractive index profile repeating those of FIGS. 8(a) and 10(a). FIG. 12(b) shows the electric field strength profile of the vertical optical mode of the VCSEL structure, repeating the profile of FIG. 8(b). FIG. 12(c) displays the electric field strength profile of the tilted optical mode of the VCSEL structure. It repeats the profile of FIG. 10(b) but is inverted. The absolute values of the optical field strength that are the positive numbers are displayed in the downward vertical direction. This is done for convenience. In such a way it is more convenient to compare the nodes of the two optical field profiles. To make such a comparison, each node of the optical field profile of FIG. 12(c) is connected by a dashed line with the closest node of the optical field profile of FIG. 12(b). One can notice that the optical field profile of FIG. 12(b) contains one extra node.

The fact that two optical modes differ in number of nodes by one is a common feature of the neighboring modes of any optical waveguide. A one skilled in the art will agree that the optical modes of the same waveguide can be sorted by the effective refractive index, or, by the effective angle of propagation. If the modes are sorted by the effective angle of propagation starting from the maximum angle with respect to the vertical direction, then the number of nodes of those optical modes will be incremental, starting from zero till the maximum number of nodes reached for the mode closest to the vertical one. The latter is the number of nodes of the vertical optical mode of the VCSEL structure. The "neighboring" mode that is the tilted mode of FIG. 12(c) will have the number of nodes equal to that number for the VCSEL mode minus one.

Let us denote the optical field strength profile of the vertical mode as $E_1(z)$ and the optical field strength profile of the tilted mode as $E_2(z)$, both profiles being complex functions of the vertical coordinate z. Thus, the absolute values $|E_1(z)|$ and $(-|E_2(z)|)$ are plotted in FIGS. 12(b) and 12(c), respectively. A one skilled in the art will agree that the two different optical modes calculated for the same refractive index profile (in this case for the vertical profile of the refractive index in the aperture, i.e. in the non-oxidized region), are orthogonal to each other, and the corresponding overlap integral vanishes, $$I_{1\text{-}2}^{aperture\text{-}aperture} = \int (E_2^{aperture})^*(z) E_1^{aperture}(z) dz = 0 \quad (11)$$

The orthogonality of the two optical modes displayed in FIGS. 12(b) and 12(c) can be qualitatively illustrated in the following way. It is convenient to fix an arbitrary phase of the complex functions $E_1(z)$ and $E_2(z)$, such that at a certain point in the center of the structure both fields have real values. Then the imaginary part of the fields will remain small everywhere in the central part of the structure and will increase only in the vicinity of the both exits of the structure where the complex field profile transforms into an outgoing wave in the air or in the substrate. Let then the both approximately real fields are of the same sign in the bottom central part of the structure, below the point of the extra node. Then this part of the structure will give a positive contribution to the overlap integral (11). Then, above the extra node, one of the two fields changes the sign one time more than the other, and the top central part of the structure will give a negative contribution to the overlap integral. Because of an approximate symmetry of the field profiles with respect to the point of the extra node, both positive and negative contributions will cancel each other, and the overlap integral will vanish. Exact evaluation of the overlap integral (11) with the exact complex profiles of both fields confirms this feature.

FIGS. 13(a) and 13(b) shows the transformation of the optical power reflectance spectrum of the structure upon oxidation. FIG. 13(a) displays the optical power reflectance spectrum of the VCSEL structure of FIG. 8(a) in the aperture region, i.e. non-oxidized region. The spectrum repeats those of FIGS. 9 and 11(a). FIG. 13(b) shows the optical power reflectance spectrum of the VCSEL structure in the oxidized region. Since some of the semiconductor layers are now replaced by oxide dielectric layers with lower refractive index both dips of the spectrum are shifted towards shorter wavelengths. These shifts are marked by straight dash-dotted lines. The long wavelength dip of the structure at 883 nm is shifted to the wavelength 864 nm.

FIG. 14(a) shows the refractive index profile of the VCSEL structure in the oxidized region. In this particular structure two layers are oxidized, and these two layers have a low refractive index. FIG. 14(b) displays the electric field strength profile of the vertical optical mode of the VCSEL structure in the oxide region. The profile has two well pronounced local maxima, one at the main VCSEL cavity, and one at the second cavity located at the oxide layers. If one compares this profile with the one of FIG. 10(b), one can notice the following differences. The two local maxima of the field are now well pronounced, which means that the two cavities are at resonance or close to resonance. The electric field strength at the exits of the structure is reduced, which indicates that the finesse of the second cavity has increased due to the oxidation of the layers. The latter can further be confirmed by comparison of the spectral width of the long wavelength dip in the optical power reflectance spectra of FIGS. 11(b) and 11(a). The shift of the dip is accompanied also by a decrease of its width.

FIGS. 15(a) through 15(c) illustrate the transformation of the optical power reflectance spectra by two consecutive changes. FIG. 15(a) represents the optical power reflectance spectra of the VCSEL structure in the aperture region at normal incidence of light. The spectrum repeats those of FIGS. 9, 11(a) and 13(a). FIG. 15(b) shows the optical power reflectance spectrum of the VCSEL structure in the oxide region at the normal incidence of light. The spectrum repeats that of FIG. 13(b). Finally, FIG. 15(c) shows the optical power reflectance spectrum of the VCSEL structure in the oxide region at oblique incidence of light. Tilt angle is 10 degrees defined in the layer $Ga_{0.85}Al_{0.15}As$. The two consecutive short wavelength shifts of the dips of the optical power reflectance spectrum are illustrated by dash-dotted straight and curved lines, respectively.

Focusing on two of the three figures, namely on FIGS. 15(b) and 15(c), a following note should be given. The optical mode existing in the oxide region of the VCSEL structure at the wavelength 864 nm as the vertical optical mode, exists also at the wavelength 850 nm, at which this mode is a tilted optical mode having the tilt angle in the layers $Ga_{0.85}Al_{0.15}As$ equal to 10 degrees.

FIGS. 16(a) through 16(d) compare the two optical modes of the VCSEL structure calculated at the same wavelength 850 nm. FIG. 16(a) shows the refractive index profile in the aperture region of the VCSEL structure repeating those of FIGS. 8(a), 10(a), and 12(a). FIG. 16(b) shows the electric field strength profile of the vertical optical mode of the VCSEL structure in the aperture region, repeating the profile of FIGS. 8(b) and 12(b). FIG. 12(c) displays the electric field strength profile of the tilted optical mode of the VCSEL structure in the oxide region. Finally, FIG. 16(d) displays the refractive index profile of the VCSEL structure in the oxide region, repeating FIG. 14(a).

It should be noted that the plot of FIG. 16(c) is inverted. The absolute values of the optical field strength that are the positive numbers are displayed in the downward vertical direction. This is done for convenience. In such a way it is more convenient to compare the nodes of the two optical field profiles. To make such a comparison, each node of the optical field profile of FIG. 16(c) is connected by a dashed line with the closest node of the optical field profile of FIG. 16(b). One can notice that the optical field profile of FIG. 16(b) contains one extra node.

Figure 12:
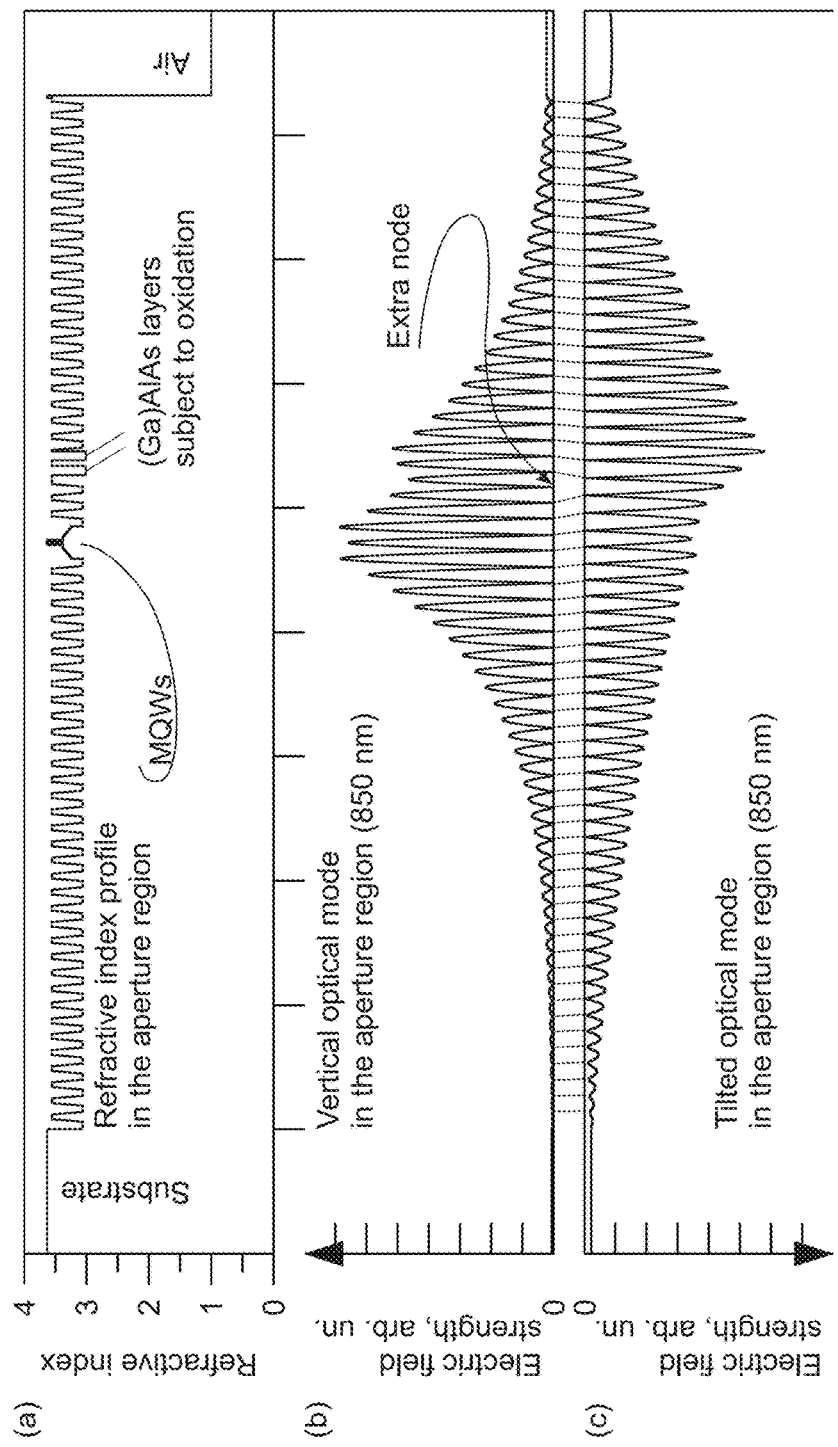

However, in contrary to the comparison of the two modes in FIG. 12, it should be emphasized, that the optical field profiles of FIGS. 16(b) and 16(c) are calculated for two different profiles of the refractive index. Therefore, there is no relation of orthogonality between these two fields and the overlap integral $$I_{1-2}^{aperture-oxide} = \int (E_2^{oxide})^*(z) E_0^{aperture}(z) dz \neq 0 \tag{12}$$

no longer vanishes.

The non-vanishing of the overlap integral can again be qualitatively explained by considering the field profile as approximately real functions in the central part of the structures. Both profiles are now not even approximately symmetric with respect to the position of the extra node. Both profiles have the maxima of the electric field strength in the bottom part of the structure. Therefore, the contribution to the overlap integral (12) from the bottom part of the structure will no longer be compensated by the contribution of the opposite sign given by the top part of the structure.

FIG. 17(b) displays two dispersion curves (wavelength versus angle) for the optical modes of the VCSEL structure of the preferred embodiment of the present invention, one curve being calculated for the aperture region, shown as a solid curve, and the second curve being calculated for the oxide region, shown as a dashed curve. It is seen from FIG. 17(b) that, contrary to the prior art VCSEL, all the optical modes in the aperture region of the VCSEL of the present invention, do have counterparts with the same wavelength in the oxide regions. Therefore, all optical modes can leak from the aperture region to the neighboring oxide regions. Typically, high-order lateral optical modes are located closer to the periphery of the aperture region, i.e. to the border between the aperture region and the oxide region, whereas the fundamental lateral mode is located rather in the central part of the aperture region. A one skilled in the art will appreciate that the leakage losses of the high-order lateral optical modes will be larger than the losses of the fundamental lateral optical mode. Therefore, if a broad aperture region supports a plurality of the lateral optical modes, the high-order lateral optical modes, existing in the structure, have larger leakage losses than the fundamental lateral optical mode. This feature promotes single mode lasing from a VCSEL with a broad aperture.

A one skilled in the art will appreciate, that the existence of the optical modes in the oxide regions, where the modes have the same wavelength as the lasing vertical mode of the aperture region is a necessary, but not a sufficient condition for the leakage to occur. It is further required that the overlap integral of Eq. (12) between the two modes is not equal zero.

It is further clear to a one skilled in the art that any change of the refractive index profile due to oxidation produces some overlap integral. However, it is a sufficiently large non-zero overlap integral that is needed to promote efficient leakage of the undesired high-order lateral optical modes from the aperture region to the oxide region. Once the optical modes are normalized such that the overlap integral of each mode with itself equals one, the preferred overlap integral of the form (12), or, more precisely, the absolute value of the overlap integral $|I_{1-2}^{aperture-oxide}|$ between the two modes should exceed 0.1, or 10%. For even more efficient leakage of the modes it is preferred that the absolute value of the overlap integral of Eq. (12) exceeds 20%.

Various embodiments are possible that allows enhancement of the above mentioned overlap integral. The methods of configuration of the refractive index profile of the VCSEL structure include, but are not limited to the methods that lead to an asymmetry in the distribution of the optical field intensity below and above the point, at which the extra node is placed and where the relative phase of two fields changes rapidly. An example is given in FIGS. 16(b) and 16(c). This point (extra node) is located just in the layers that are subject to oxidation and to a change in refractive index. In this embodiment the layers subject to oxidation are located not in the immediate vicinity of the active cavity, but a few DBR periods away.

In another embodiment of the present invention, an essentially non-zero overlap integral is achieved by selecting the layers subject to oxidation to be sufficiently thick. It is preferred that the thickness of at least one of the layers will exceed one sixth of the wavelength of the light in the semiconductor material.

In yet another embodiment of the present invention, the number of layers subject to oxidation can be taken three or more.

In a further embodiment of the present invention, the layers subject to oxidation are located not in the neighboring DBR periods, but a few periods apart from each other, thus influencing the profile of the optical mode and ensuring sufficient asymmetry and sufficient overlap integral.

Another embodiment of the present invention is possible, wherein another cavity is introduced into the VCSEL structure aimed at engineering of the optical profiles of the VCSEL modes both in the aperture region and in the oxide region. This cavity is preferably introduced adjacent to the layer or layers subject to oxidation.

In another embodiment of the present invention, this additional cavity is introduced apart from the layer or layers subject to oxidation, but at the same side from the active cavity.

In yet another embodiment of the present invention, this additional cavity is introduced at the side from the active cavity opposite to the layer or layers subject to oxidation.

It is important to emphasize that the leakage losses of the optical modes depend also on the spectral separation between the vertical optical mode in the aperture region (left dip in FIG. 9, 11(a), 13(a) or 15(a), at 850) and the vertical optical mode in the oxide region (right dip in FIG. 13(b) or 15(b), at 864 nm). First, modification of the refractive index profile due to the oxidation of semiconductor layers affect at the same time, both the vertical profile of the optical mode and the wavelength of the mode. Second, the leakage loss depend, in addition to the overlap integral of Eq. (12), also on the density of photon states in the oxide region, and this density of states is a function of the spectral separation between the two dips.

In a further embodiment of the present invention, the resonant interaction occurs between the VCSEL-type vertical mode in the aperture region and not the tilted optical mode of the oxide region which is the nearest mode to the VCSEL mode, but the next nearest tilted mode. The next nearest tilted mode has two nodes less than the VCSEL mode, and the relative phase of the two modes is inverted twice. Therefore, the contribution to the overlap integral coming from the bottom part of the structure, below the first extra node, and the contribution to the overlap integral coming from the top part of the structure, above the second extra node, are of the same sign, and the contribution to the overlap integral, coming from the part of the structure between the first and the second extra nodes is of the opposite sign. If the spacing between the two extra nodes is sufficiently small, the contribution of the bottom part and the top parts combined, prevail over the contribution of the central part, and the overlap integral can be made essentially non-zero.

In another embodiment of the present invention, no second cavity is formed in the adjacent region by the oxide layers, and the optical mode in the oxide region is formed by the resonant interaction of the cavity and a distributed Bragg reflector or another multilayer interference reflector.

A one skilled in the art will appreciate that many realizations of the structure in the oxide region are possible, in which the optical modes in the oxide region form a continuum spectrum, with which the optical modes of the aperture region interact resonantly. Various change of the shape of the vertical optical mode in the oxide region with respect to the shape of the vertical optical mode in the aperture region can result in such resonant interaction. A particular optimization of each of those structures will allow the overlap integral of Eq. (12) to be sufficiently large in its absolute value.

Thus, multiple realizations of single mode lasing from a VCSEL with a broad aperture are possible.

FIG. 28 illustrates schematically a VCSEL (2800) of the present invention. The VCSEL is grown epitaxially on a preferably n-doped substrate (2801) and contains a bottom n-doped DBR (2822), an active undoped cavity (2823), and a top p-doped DBR (2828). The active cavity (2823) contains an active region (2827) introduced into undoped layers (2826). A first, n-doped contact (2811) is mounted on the bottom side of the n-doped substrate (2801). A second, p-contact (2812) is mounted on a p-contact layer (2872) on top of the top p-doped DBR (2828). A forward bias (2813) is applied to the active region (2827). A one or several layers of the p-doped DBR (2828) are oxidized forming oxide layers (2824). The oxide layers define the aperture region (2851) and the oxide region (2852) of the device, whereas these two regions are adjacent in the lateral plane. Multiple embodiments described above in detail explain how the leakage of the optical modes from the aperture region into the oxide region can be engineered such that the losses of the high-order lateral optical modes of the aperture region are significantly larger than the losses of the fundamental lateral optical mode. These properties of the device result in the emission of the single mode laser light (2835).

Another group of embodiments of the present invention refer to electrooptically modulated VCSEL, or EOM VCSEL. Devices of this type are disclosed in the U.S. Pat. No. 7,369,583 "ELECTROOPTICALLY WAVELENGTH-TUNABLE RESONANT CAVITY OPTOELECTRONIC DEVICE FOR HIGH-SPEED DATA TRANSFER", filed Jun. 2, 2005, issued May 6, 2008, U.S. Pat. No. 7,593,436 "ELECTROOPTICALLY BRAGG-REFLECTOR STOP-BAND-TUNABLE OPTOELECTRONIC DEVICE FOR HIGH-SPEED DATA TRANSFER", filed Jun. 16, 2006, issued Sep. 22, 2009, and U.S. Pat. No. 8,290,016 "OPTOELECTRONIC DEVICE FOR HIGH-SPEED DATA TRANSFER WITH ELECTROOPTICALLY TUNABLE STOPBAND EDGE OF A BRAGG REFLECTOR", filed Jul. 27, 2009, issued Oct. 16, 2012, all patents by the inventors of the present invention, wherein all these patents are incorporated herein by reference.

The EOM VCSEL (1800) of an embodiment of the present invention is shown schematically in FIG. 18. The EOM VCSEL is grown epitaxially on a preferably n-doped substrate (1801) and contains a bottom n-doped DBR (1822), an active undoped cavity (1823), and a top DBR (1860). The top DBR (1860) consists of a p-doped part (1861), and undoped part (1862), and an n-doped part (1863). The active cavity (1823) contains an active region (1827) introduced into undoped layers (1826). An electrooptic medium (1866) is introduced into an undoped part (1862) of the top DBR (1860). A first, n-doped contact (1811) is mounted on the bottom side of the substrate (1801). A second, p-contact (1812) is mounted on a p-contact layer (1872) in the p-doped part (1861) of the top DBR (1860). A third, n-contact (1891) is mounted on the n-contact layer (1873) on top of the top, n-part (1863) of the top DBR (1860). A forward bias (1813) is applied to the active region (1827). A reverse bias (1893) is applied to the electrooptic medium (1866). A one or several layers of the p-doped part (1861) of the top DBR (1860) are oxidized forming oxide layers (1824). The oxide layers define the aperture region (1851) and the oxide region (1852) of the device, whereas these two regions are adjacent in the lateral plane.

Figure 19:
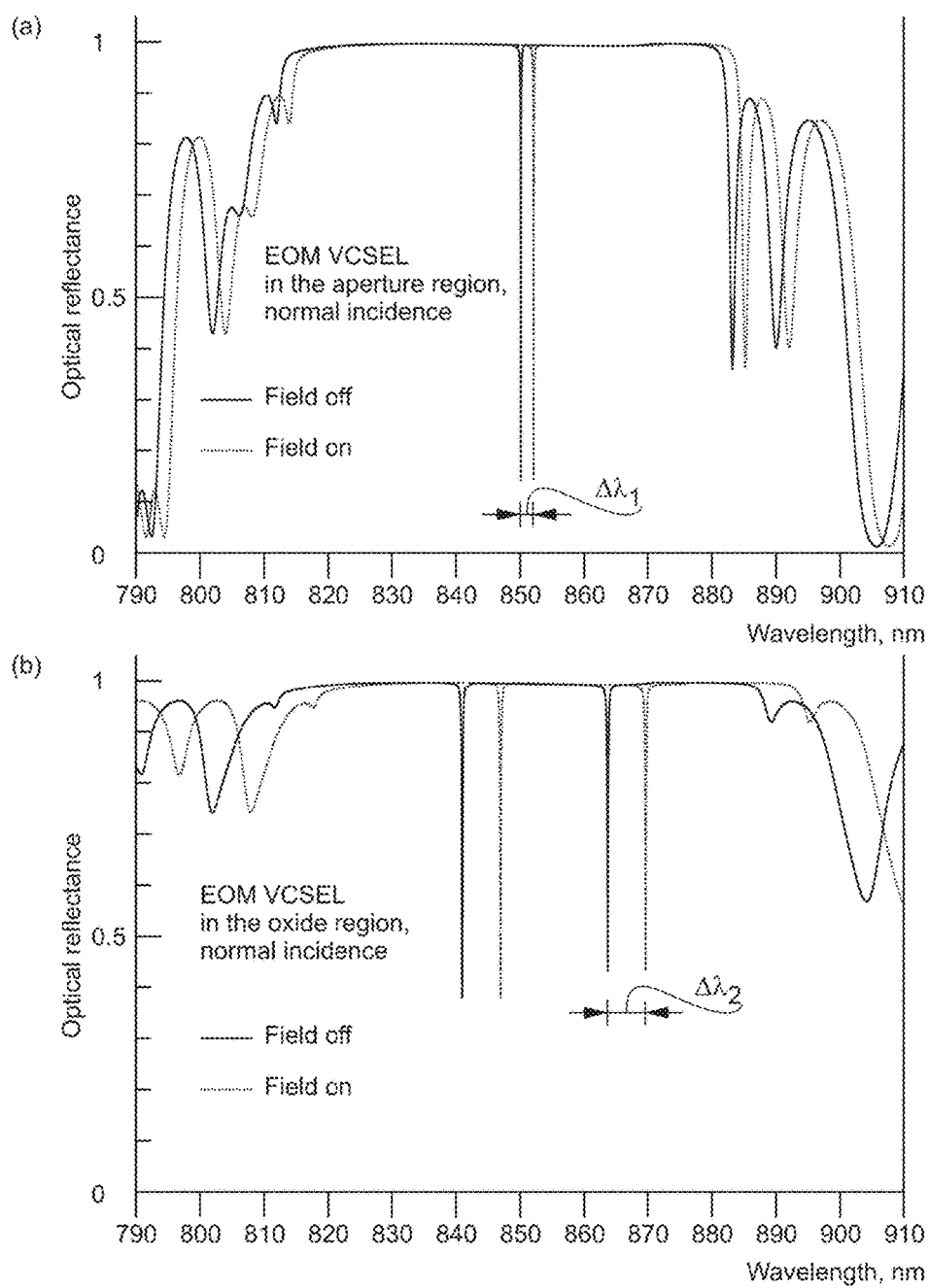

The operation principle of the EOM VCSEL (1800) is distinct from those of the prior art and is illustrated in FIG. 19. Once electric field is applied to the electrooptic medium (1866), its refractive index changes. Correspondingly, the spectral positions of the features of the optical power reflectance spectrum of the structure shift. It follows from FIGS. 16($b$) and 16($c$) that the optical field profile in the oxide region is shifted to the top of the structure with respect to the optical field profile in the aperture region. Therefore, the intensity of the optical field above the oxide layers is larger for the mode in the oxide region than for the mode in the aperture region. As the electrooptic medium (1866) is positioned above the oxide layers (1824), the shift of the features of the optical power reflectance spectrum in the oxide region ($\Delta\lambda_2$ in FIG. 19($b$)) exceeds the shift of the optical power reflectance spectrum in the aperture region ($\Delta\lambda_1$ in FIG. 19($a$)). This is illustrated in FIGS. 19($a$) and 19($b$), $\Delta\lambda_2 > \Delta\lambda_1$. Thus, by applying electric field to the electrooptic medium (1866), it is possible to shift the spectral separation between the vertical optical mode in the aperture region and the vertical optical mode in the oxide region. Such a shift changes the leakage losses of the optical modes from the aperture region to the oxide region. This is valid for all optical modes in the aperture region, including the fundamental optical mode. Change of the leakage loss affects also the power of the output light (1835). Thus, applying electric field to the electrooptic medium allows modulation of the intensity of the output light coming out of the device.

In another embodiment of the present invention, the vertical profiles of the optical modes in the aperture region and oxide region are configured such that the spectral shift of the features of the optical power reflectance spectrum is larger in the aperture region.

In yet another embodiment of the present invention, the spectral shifts of the optical features of the optical power reflectance spectra due to electrooptic effect occurs towards shorter wavelengths. In another embodiment of the present invention, the electrooptic medium is positioned in a resonant cavity.

In a further embodiment of the present invention, the electrooptic cavity and the active cavity interact resonantly, and variation of the leakage losses due to electrooptic effect results in a change of the wavelength of the light emitted by the device.

One another embodiment of the present invention is possible, in which the structural element containing elctrooptic medium operates as an electroabsorption modulator.

In another group of embodiments of the present invention the structure of the device in the aperture region is configured such that not a vertical mode, but a tilted mode propagating at a certain non-zero angle with respect to the direction normal to the layers of the structure is the designated mode that should lase. Also for such a device, which is known as tilted cavity laser, the present invention can be applied to enhance the leakage losses of the undesired lateral modes, the leakage occurring to the oxide region of the structure.

Figures from 20(*a*) through 24(*d*) describe a similar approach to edge-emitting lasers. FIG. 20(*a*) shows schematically a cross-section of a prior art ridge edge-emitting laser (2000). The laser is grown on an n-doped substrate (2001), and contains an n-doped buffer layer (2015), a bottom n-doped cladding (2002), an active cavity (2003), and a top p-doped cladding (2008). An active region (2005) is placed within the active cavity (2003). A p-contact layer (2009) is grown on top of the top p-doped cladding (2008). An n-contact (2011) is mounted on the back (bottom) side of the n-doped substrate (2001). A p-contact (2012) is mounted on top of the p-contact layer (2009). A layer or layers of $Al_xGa_{1-x}As$ layers with a high (x>0.9) AlAs concentration are grown inside the top cladding layer (2008), and the layers are oxidized forming the oxide layers (2020). Such an aperture also serves to determine the way of current flow through the active region. FIG. 20(*b*) shows schematically a planar cross-section of the prior art edge-emitting laser of FIG. 20(*a*) showing the aperture region (2030) and the oxide region (2040). The aperture region defines the aperture for the flow of the current underneath non-oxidized regions of the structure.

Figure 21:
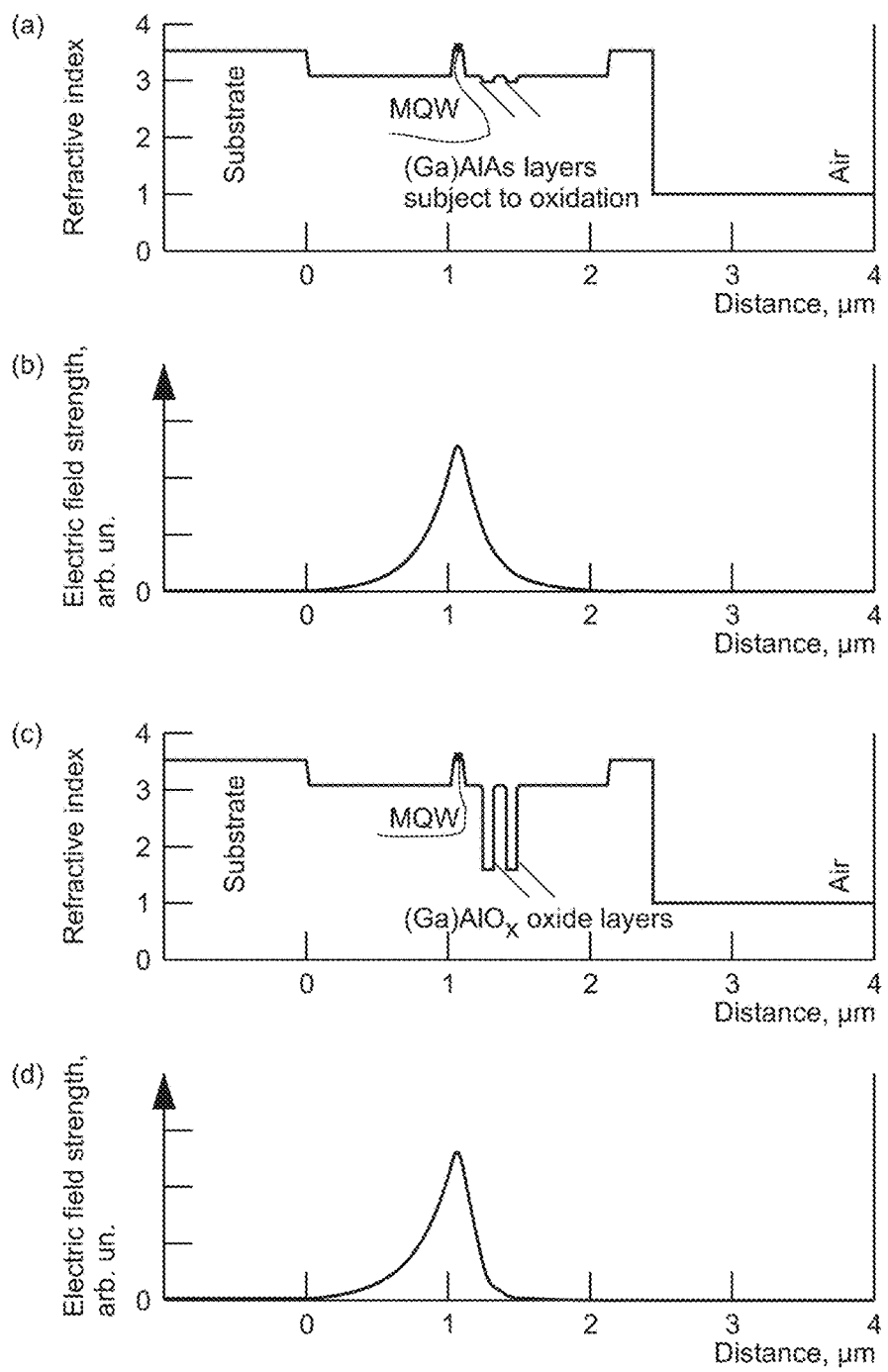

FIG. 21(*a*) shows a vertical refractive index profile of the prior art edge-emitting laser in the aperture region showing $Al_xGa_{1-x}As$ layers with a high (x>0.9) AlAs concentration.

FIG. 21(*b*) displays the electric field strength profile of the optical mode in the aperture region of the prior art edge-emitting laser structure of FIG. 21(*a*).

FIG. 21(*c*) depicts the vertical refractive index profile of the prior art edge-emitting laser of FIG. 21(*a*) in the oxide region showing two oxide layers $(Ga)AlO_y$.

FIG. 21(*d*) shows the electric field strength profile of the optical mode in the oxide region of the prior art edge-emitting laser structure of FIG. 21(*a*) showing repelling of the optical mode from the oxide layers.

Figure 22:
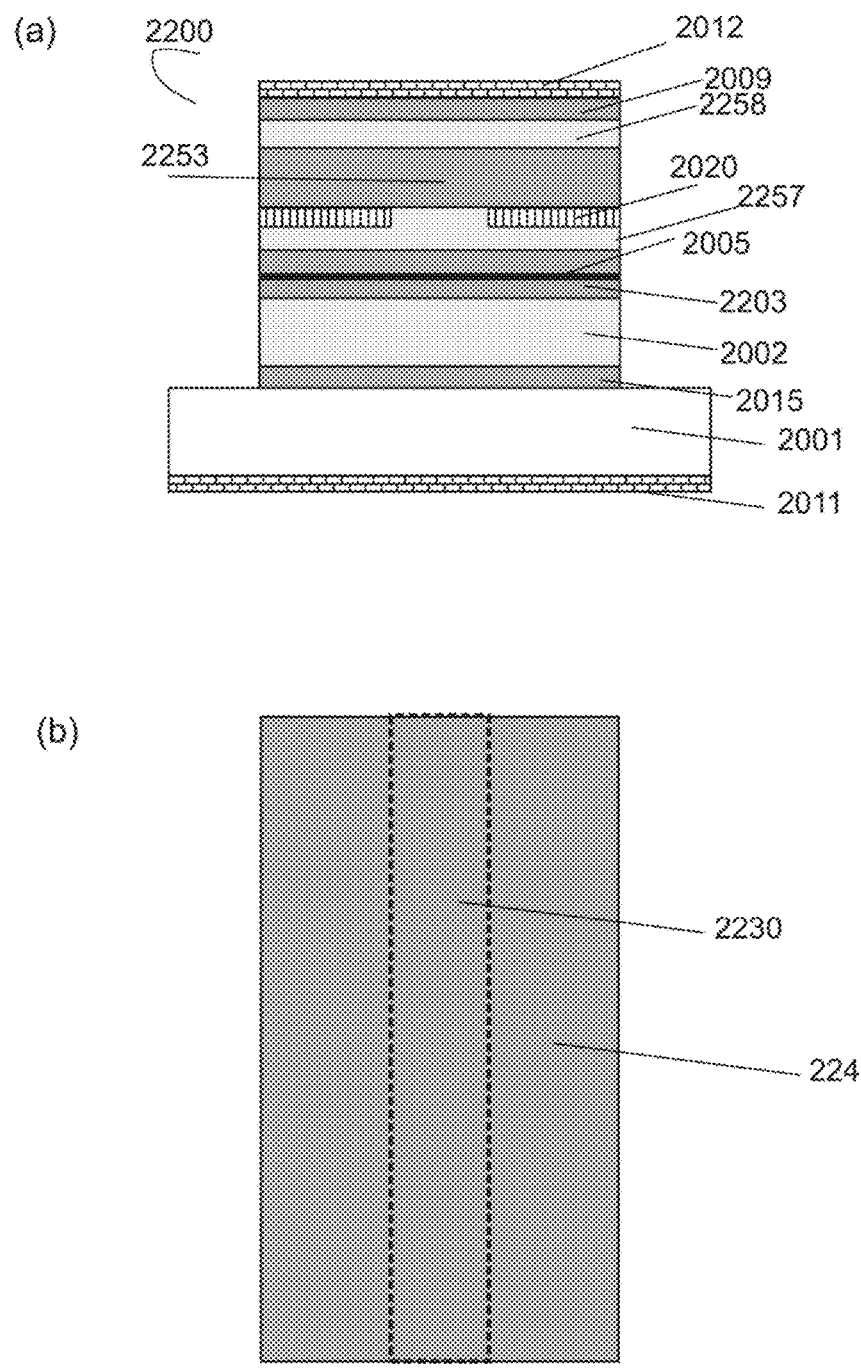

FIG. 22(*a*) shows a cross-section of an edge-emitting laser (2200) according to an embodiment of the present invention. The laser contains two coupled cavities, (2203) and (2253). The top cladding layer consists of two parts, a first cladding layer (2257), and a second cladding layer (2258). The layers of AlAs or $Al_xGa_{1-x}As$ layers with a high (x>0.9) AlAs concentration are inserted at the boundary between the cladding layer and the second cavity. These layers, after oxidation, form an aperture determining the current flow through the active region.

FIG. 22(*b*) shows schematically a planar cross-section of the edge-emitting laser of FIG. 22(*a*) showing the aperture region (2230) and the oxide region (2240). The aperture region defines the aperture for the flow of the current underneath non-oxidized regions of the structure.

Yet another embodiment of the present invention includes layers subject to oxidation positioned inside the second cavity.

A further embodiment of the present invention includes the layers subject to oxidation placed within the cladding layer.

Figure 23:
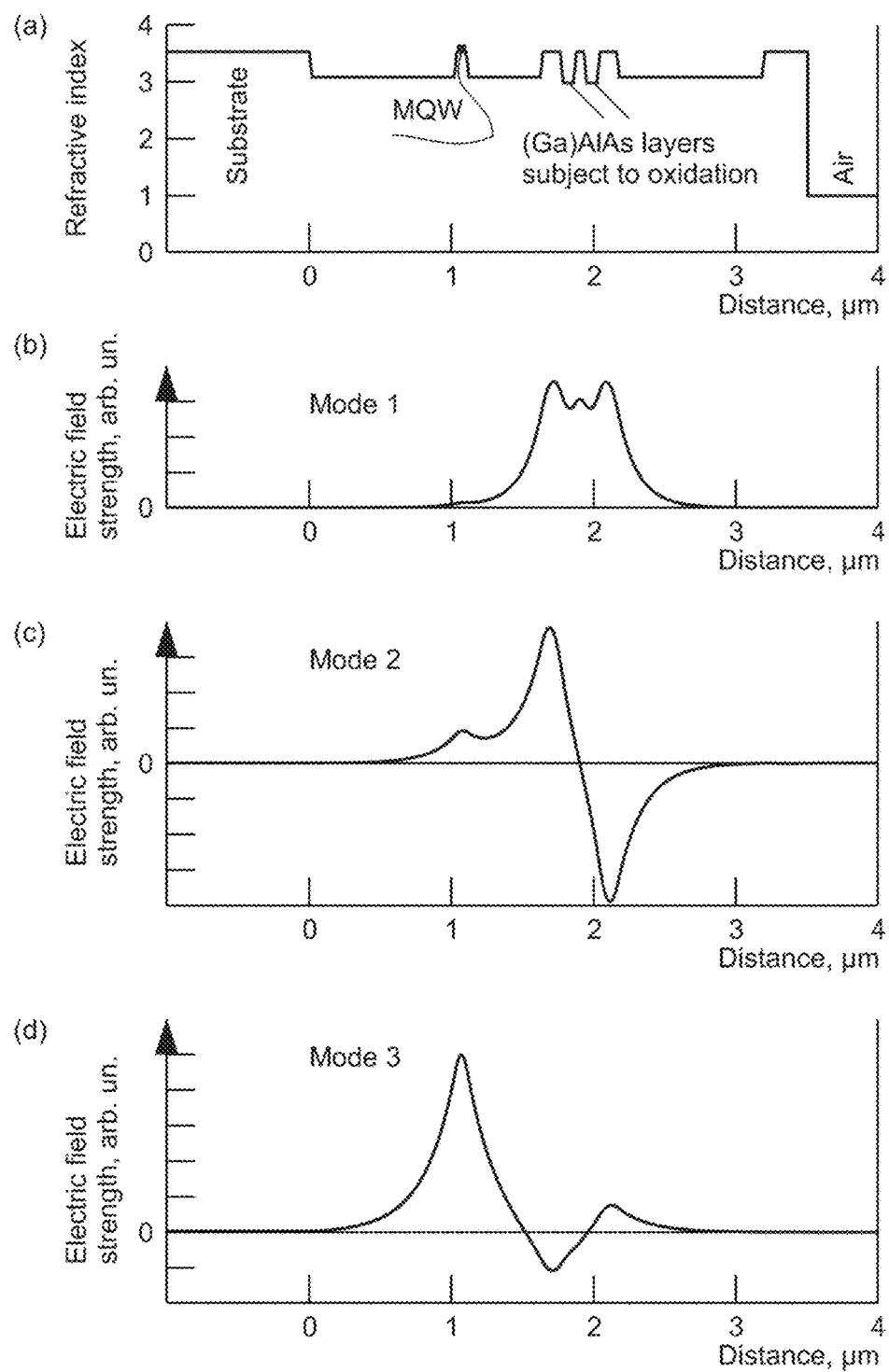

FIG. 23(*a*) shows the refractive index profile in the vertical direction for an edge-emitting laser according to the embodiment of FIGS. 22(*a*) through 22(*d*). The laser contains two cavities. The first cavity contains the active region formed by multiple quantum wells (MQWs). The second cavity contains one or plurality layers of AlAs or $Al_xGa_{1-x}As$ layers with a high (x>0.9) Al content. The profile of FIG. 23(*a*) refers to the aperture region where no layers are oxidized.

FIG. 23(*b*) through 23(*d*) display the electric field strength profile for the three optical modes of the structure. The two cavities are not in resonance. Only one mode (mode 3) has a significant optical confinement factor in the active region. This mode decays rapidly and does not penetrate to the upper cavity.

Figure 24:
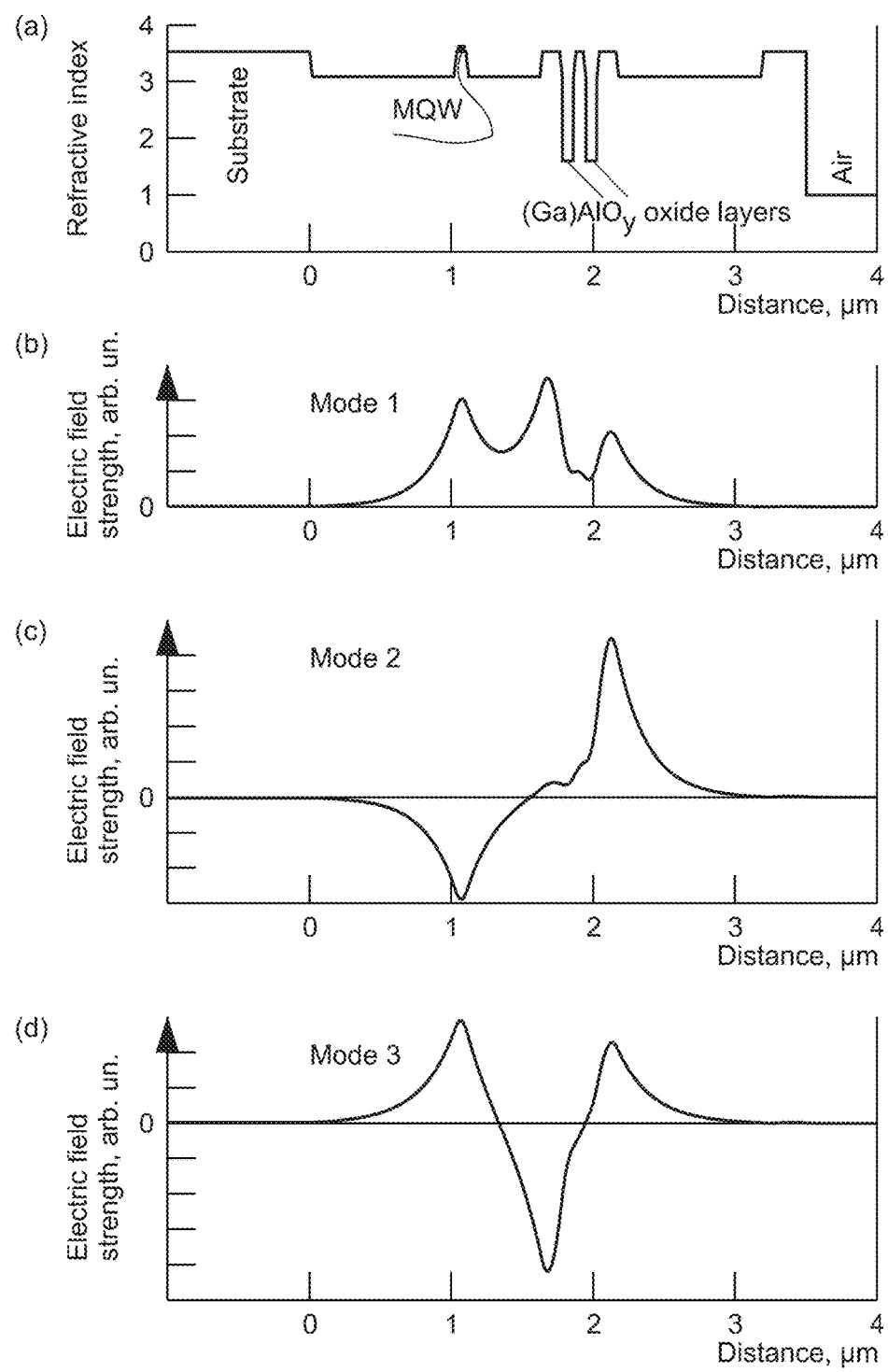

FIG. 24(*a*) shows the refractive index profile in the vertical direction for the same edge-emitting laser, but in the oxide region. The two cavities are now at resonance. All three modes displayed in FIGS. 24(*b*) through 24(*d*) have approximately the same optical confinement factor in the active region.

A one skilled in the art will agree that three modes contribute to the resonance due to the fact that the oxide layers are placed at a specific position in the second cavity. If the oxide layers are placed in a rather general position, only two modes will contribute to the resonance. Furthermore, formation of optical modes at resonance will have the same effect on the leakage properties of the optical modes from the aperture region to the oxide regions, as it has in the case of VCSELs. The continuum spectrum of the optical modes in the oxide region originating from the longest wavelength split vertical mode, will allow all the modes to leak from the aperture region to the oxide regions, similar to that of FIG. 17(*b*). Then, high order lateral modes in the aperture region will have larger leakage losses than the fundamental lateral mode. This will allow single lateral mode lasing in devices with broad stripes.

FIG. 25 shows schematically a plan view of an array (2500) of phase-coupled VCSELs, according to yet another embodiment of the present invention. An array of holes (2560) is formed on the surface. The oxidation process is carried out. As a result of the process oxide regions (2520) are formed around the holes. The width of the oxide arrays is preferably selected such that the oxide regions formed around neighboring holes overlap or are close to overlap. The areas (2510) between the oxide regions are the areas, in which the current flow through the active region is possible. The contact is deposited onto these areas (2510). The epitaxial structure is configured according to the present invention (FIGS. 8(*a*) through 16(*d*), and 17(*b*)). The optical modes excited beneath the contacts leak into the oxide regions. Due to a sufficiently strong coupling between neighboring oxide regions, a single coherent mode can be formed extending over the entire array of VCSELs. In a further embodiment of the present invention, a single coherent mode extends across the entire wafer.

Figure 26:
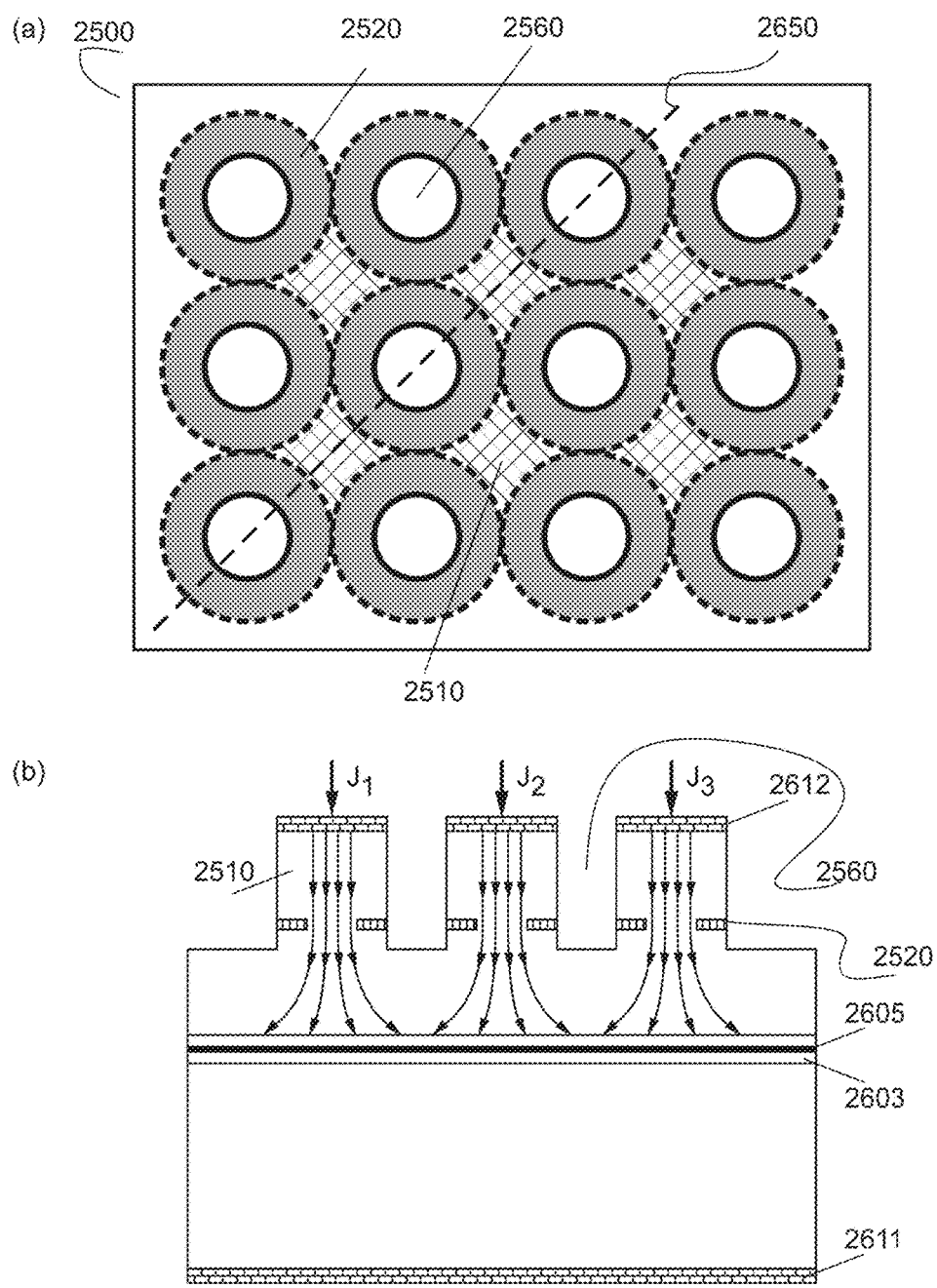

FIGS. 26(*a*) and 26(*b*) shows schematically an array of phase coupled VCSELs, which is used for beam steering. FIG. 26(*a*) repeats FIG. 25, and contains additionally a line (2650) which defines a vertical plane.

FIG. 26(*b*) shows schematically a cross-section of the array of phase-coupled VCSELs (2500) in the vertical plane defined by the line (2650). The top contact (2612) is deposited on the top surface of the array, except the holes (2560). The contacted area (2510) is depicted in FIG. 26(*b*) as three parts that are not electrically connected. Through each part, an independent current ($J_1$, $J_2$, or $J_3$) flows. The current spreads and reaches the active cavity (2603), in which the active region (2605) is placed. The bottom contact (2611) is preferably formed as a single contact for the whole array. The array of VCSELs (2500) is capable to emit a phase coupled laser light. The individually controllable currents ($J_1$, $J_2$, or $J_3$) control the phase of the phase-coupled optical field of the laser light, and, hence, the direction, the vertical or tilted at a controlled angle, of the emitted coherent laser beam.

A one skilled in the art will appreciate, that, similar to an array of circular holes (2560), and array of elongated holes can be formed. This array can be configured such that it fixes polarization of a polarized laser light emitted by the array.

A one skilled in the art will appreciate that an array similar to that of FIGS. 25 and 26 can be configured such that each pumped area of the array does not generate laser light but operates as a light-emitting diode or a gain chip. Then, once put into an external cavity, the array will generate laser light, similar to a Vertical-External-Cavity Surface-Emitting Laser (VECSEL).

In a further embodiment of the present invention, a array of coherently coupled surface emitters is employed as a source of a primary light in a system for frequency conversion, e.g. in a system for the generation of a second harmonics of the laser light.

FIG. 27 shows schematically a plan view of a coherently coupled array (2700) of edge-emitters, according to another embodiment of the present invention. An array of holes (2760) is formed on the surface. The oxidation process is carried out. As a result of the process oxide regions (2720) are formed around the holes. The width of the oxide arrays is preferably selected such that the oxide regions formed around neighboring holes overlap forming extended oxide areas shown approximately as grey rectangles. Current is injected through the contacts (2712). The epitaxial structure is designed according to the present invention (FIGS. 22(a) through 24 (d)). The optical modes excited beneath the contacts leak into the oxide regions. Due to a sufficiently strong coupling between neighboring oxide regions, a single coherent mode can be formed across the array of edge-emitting lasers. In a further embodiment of the present invention, a single coherent mode extends across the entire wafer.

In yet another embodiment of the present invention, an array of edge-emitters is a stack of edge-emitters.

In a further embodiment of the present invention, an array of edge-emitters is a one-dimensional laser bar.

A one skilled in the art will appreciate that an array of edge-emitters can be configured as an array of edge-emitting gain chips which, once taken alone, do not generate laser light. But laser light is generated once such an array is put into an external cavity.

In another embodiment of the present invention, an array of edge-emitters is a one-dimensional bar of edge-emitting gain chips configured for the laser operation in an external cavity.

In yet another embodiment of the present invention, an array of edge-emitters is a two-dimensional stack of edge-emitting gain chips configured for the laser operation in an external cavity.

In a further embodiment of the present invention, an array of edge-emitters is employed as a source of a primary light in a system for frequency conversion, e.g. in a system for the generation of a second harmonics of the laser light.

In another embodiment of the present invention, the oxide formed in the selectively oxidized layers can be removed, e.g. by chemical etching, and air gaps can be formed in the semiconductor structure.

In yet another embodiment of the present invention, the areas with a low refractive index are formed not by selective oxidation, but by selective removal of the semiconductor material. This can be realized by selective chemical etching of certain layer or layers of the epitaxial structure.

In a further embodiment of the present invention, air gaps are formed where selected layers of an epitaxial structure have been etched off.

In another embodiment of the present inventions, the oxides are formed as a result of the selective oxidation of the semiconductor layers, and, afterwards, oxides are removed forming air gaps.

A one skilled in the art will appreciate that each method of forming second domain, e.g. oxidation, etching or their combination are capable to form the area for the enhanced leakage of undesired parasitic optical modes of the optoelectronic device. All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. An optoelectronic device comprising
a) a multilayer structure;
b) an aperture region;
   wherein a set of optical modes having a first vertical profile are formed in said aperture region,
   wherein said set of optical modes contains a fundamental lateral optical mode and at least one high-order lateral optical mode; and
c) an adjacent region contiguous in a lateral direction to said aperture region,
   wherein at least one layer in said adjacent region has a lower refractive index than a refractive index of this layer in said aperture region, and
   wherein a continuum spectrum of optical modes having a second vertical profile is formed in said adjacent region, and
wherein at least one high-order lateral optical mode formed in said aperture region has a wavelength at resonance with the wavelength of at least one mode of said continuum spectrum of optical modes in said adjacent region, and
wherein said first vertical profile and said second vertical profile have an non-zero overlap integral, and
wherein the leakage losses of said at least one high-order lateral optical mode formed in said aperture region is larger than the leakage losses of said fundamental lateral optical mode formed in said aperture region.

2. The optoelectronic device of claim 1, wherein said overlap integral exceeds ten percent.

3. The optoelectronic device of claim 2, wherein said overlap integral exceeds twenty percent.

4. The optoelectronic device of claim 1,
wherein all high-order lateral optical mode of the said aperture region have larger resonant leakage losses than said fundamental lateral optical mode of said aperture region due to the resonant coupling to said continuum spectrum of optical modes of said adjacent region.

5. The optoelectronic device of claim 1, wherein said aperture region further comprises an active medium.

6. The optoelectronic device of claim 5, further comprising
d) a means of generating non-equilibrium carriers in said active medium.

7. The optoelectronic device of claim 6, wherein said optoelectronic device operates as a single lateral mode optoelectoronic device.

8. The optoelectronic device of claim 6, wherein said means of generating of non-equilibrium carriers are selected from the group consisting of:
(i) current injection,
(ii) photoexcitation,
(iii) electron beam excitation.

9. The optoelectronic device of claim 1, wherein formation of said at least one layer having a low refractive index is achieved by lateral oxidation of the material having a high concentration of aluminum atoms.

10. The optoelectronic device of claim 1, wherein formation of said at least one layer having a low refractive index is achieved by selective removal of the layers adjacent to said aperture region.

11. The optoelectronic device of claim 1,
wherein said continuum of optical modes in said adjacent region is formed by a continuum of lateral optical modes in said adjacent region associated with at least one vertical optical mode in said adjacent region;
wherein said at least one vertical optical mode in said adjacent region is defined as an optical mode in the vertical direction;
wherein said vertical direction is the direction perpendicular to said lateral plane.

12. The optoelectronic device of claim 11, wherein said at least one vertical optical mode in said adjacent region is an optical mode confined in said vertical direction.

13. The optoelectronic device of claim 11, wherein said at least one vertical optical mode in said adjacent region is realized by resonant interaction of two or more optical cavities.

14. The optoelectronic device of claim 11, wherein said at least one vertical optical mode in said adjacent region is realized by resonant interaction of an optical cavity and at least one multilayer interference reflector.

15. The optoelectronic device of claim 1, wherein said adjacent region contiguous to said aperture region is a region surrounding said aperture region.

16. The optoelectronic device of claim 5,
wherein said active medium is selected from a group consisting of:
i) bulk material;
ii) quantum wells;
iii) quantum wires;
iv) quantum dots;
v) any combination of i) through iv).

17. The optoelectronic device of claim 1,
wherein the materials used for fabrication of the device are selected from the group consisting of:
(i) III-V materials;
(ii) III-N materials;
(iii) II-VI materials;
(iv) group IV materials; and
(v) any combination of (i) through (iv).

18. The optoelectronic device of claim 6, wherein said optoelectronic device is selected from the group consisting of:
(i) light-emitting diode;
(ii) edge-emitting laser diode;
(iii) surface-emitting laser diode;
(iv) tilted wave laser diode;
(v) tilted cavity laser diode;
(vi) semiconductor disc laser;
(vii) passive cavity laser;
(viii) single photon emitter;
(ix) emitter of entangled photons;
(x) semiconductor gain chip.

19. The optoelectronic device of claim 18,
wherein said optoelectronic device is selected from the group of devices from (iii) through (ix) of claim 18;
wherein said at least one layer in said adjacent region having a lower refractive index than the same layer has in the aperture region, is positioned such that its position within said aperture region is a position at a node of the optical field intensity of said first vertical profile.

20. The optoelectronic device of claim 6, further comprising
e) an electrooptic medium.

21. The optoelectronic device of claim 20, further comprising
f) a means to apply electric voltage to said electrooptic medium.

22. The optoelectronic devices of claim 21, wherein applying voltage to said electrooptic medium results in change of the leakage losses of at least one lateral optical mode of said aperture region.

23. The optoelectronic devices of claim 22,
wherein said change of the leakage losses of said at least one lateral optical mode of said aperture region results in a way of operation of said optoelectronic device selected from the group of possible ways of operation including:
i) modulation of the intensity of the emitted light;
ii) modulation of the wavelength of the emitted light; and
iii) a combination of i) and ii).

24. An array of optoelectronic devices comprising at least two optoelectronic devices according to claim 1.

25. The array of optoelectronic devices of claim 24, wherein the optical fields of said at least two devices of said array of optoelectronic devices are coherently optically coupled with each other.

26. The array of optoelectronic devices of claim 24, wherein said array is employed for the steering of the laser beam.

27. The array of optoelectronic devices of claim 24, wherein all optoelectronic devices forming said array are positioned on a single wafer.

28. The array of optoelectronic devices of claim 24, wherein said at least two optoelectronic devices are positioned on two different wafers.

29. The array of optoelectronic devices of claim 24, wherein said array of optoelectronic devices is further positioned into an external cavity.

30. The array of optoelectronic devices of claim 24, wherein said array of optoelectronic devices is a source of the primary light for a frequency conversion system.

* * * * *